United States Patent
Baltazar et al.

(10) Patent No.: US 11,325,152 B2
(45) Date of Patent: May 10, 2022

(54) VESSELS, CONTAINERS, AND SURFACES COATED WITH WATER BARRIER COATINGS

(71) Applicant: SiO2 Medical Products, Inc., Auburn, AL (US)

(72) Inventors: Martin Baltazar, Auburn, AL (US); Adam Breeland, Auburn, AL (US); Thomas E. Fisk, Green Valley, AZ (US); David Henton, Midland, MI (US); Brian Maurer, North Wales, PA (US); Ahmad Taha, Aburn, AL (US); Christopher Weikart, Auburn, AL (US)

(73) Assignee: SIO2 Medical Products, Inc., Auburn, AL (US)

( * ) Notice: Subject to any disclaimer, the term of this patent is extended or adjusted under 35 U.S.C. 154(b) by 0 days.

(21) Appl. No.: 17/042,745

(22) PCT Filed: Mar. 27, 2019

(86) PCT No.: PCT/US2019/024339
§ 371 (c)(1),
(2) Date: Sep. 28, 2020

(87) PCT Pub. No.: WO2019/191269
PCT Pub. Date: Oct. 3, 2019

(65) Prior Publication Data
US 2021/0101176 A1 Apr. 8, 2021

Related U.S. Application Data

(60) Provisional application No. 62/692,038, filed on Jun. 29, 2018, provisional application No. 62/689,541, (Continued)

(51) Int. Cl.
*B05D 7/22* (2006.01)
*B05D 1/00* (2006.01)
(Continued)

(52) U.S. Cl.
CPC ............... *B05D 7/227* (2013.01); *B05D 1/62* (2013.01); *B05D 7/50* (2013.01); *C23C 16/045* (2013.01);
(Continued)

(58) Field of Classification Search
None
See application file for complete search history.

(56) References Cited

U.S. PATENT DOCUMENTS

2008/0241512 A1 10/2008 Boris et al.
2010/0140205 A1 6/2010 Ito et al.
(Continued)

*Primary Examiner* — Shamim Ahmed
*Assistant Examiner* — Bradford M Gates
(74) *Attorney, Agent, or Firm* — McAndrews, Held & Malloy Ltd.

(57) ABSTRACT

A vessel has a lumen defined at least in part by a wall. The wall has an interior surface facing the lumen, an outer surface, and a plasma-enhanced chemical vapor deposition (PECVD) coating set supported by the wall. The PECVD coating set comprises a water barrier coating or layer having a water contact angle from 80 to 180 degrees, applied using a precursor comprising at least one of a saturated or unsaturated fluorocarbon precursor having from 1 to 6 carbon atoms and a saturated or unsaturated hydrocarbon having from 1 to 6 carbon atoms. Optionally, the coating set includes an SiOx gas barrier coating or layer from 2 to 1000 nm thick, in which x is from 1.5 to 2.9 as measured by x-ray photoelectron spectroscopy (XPS), and optionally other related coatings.

19 Claims, 7 Drawing Sheets

Related U.S. Application Data filed on Jun. 25, 2018, provisional application No. 62/648,778, filed on Mar. 27, 2018.

(51) Int. Cl.
  *B05D 7/00*  (2006.01)
  *C23C 16/04* (2006.01)
  *C23C 16/36* (2006.01)
  *C23C 16/40* (2006.01)

(52) U.S. Cl.
  CPC ............ *C23C 16/36* (2013.01); *C23C 16/401* (2013.01); *B05D 2201/02* (2013.01)

(56) References Cited

U.S. PATENT DOCUMENTS

| | | |
|---|---|---|
| 2012/0252709 A1 | 10/2012 | Felts et al. |
| 2013/0041241 A1 | 2/2013 | Felts et al. |
| 2016/0015600 A1 | 1/2016 | Weikart et al. |

VESSELS, CONTAINERS, AND SURFACES COATED WITH WATER BARRIER COATINGS

This application is a U.S. National Phase Application of International Application No. PCT/US2019/024339, filed Mar. 27, 2019, which claims priority to U.S. Provisional Application Nos. 62/648,778, filed Mar. 27, 2018, 62/689,541, filed Jun. 25, 2018 and 62/692,038, filed Jun. 29, 2018. The specifications of U.S. Pat. No. 7,985,188, International Application Nos. PCT/US2014/023813, PCT/US16/47622 and U.S. Provisional Application Nos. 61/800,746, filed Mar. 15, 2013; 62/335,506, filed May 12, 2016; 62/473,777, filed Mar. 20, 2017; 62/648,778, filed Mar. 27, 2018; 62/689,541, filed Jun. 25, 2018; and 62/692,038, filed Jun. 29, 2018; are incorporated herein by reference in their entirety. These patents/applications describe apparatus, vessels, precursors, coatings or layers and methods (in particular coating methods and test methods for examining the coatings or layers) which can generally be used in performing the present invention, unless stated otherwise herein. They also describe $SiO_x$ barrier coatings or layers and $SiO_xC_y$ coatings to which reference is made herein.

FIELD OF THE INVENTION

The present invention relates to the technical field of PECVD coated, flat or non-flat surfaces with improved water barrier properties. More specifically, the invention relates to a surface coated with PECVD fluorocarbon or hydrocarbon or hydrofluorocarbon coating with water barrier properties. The present invention also relates to a vessel with a water barrier coating on its interior surface or exterior surface or both.

The present invention further relates to the methods for preparing the coated surface. The present invention also relates to the use of the coated surfaces and vessels.

BACKGROUND OF THE INVENTION

One important consideration in manufacturing sample containers for storing or other contact with sample is that the sample contained will have a substantial shelf life. In many cases, the samples or contents are sensitive to air, oxygen, moisture or other environmental factors. During this shelf life, it is important to isolate the sample filling the containers from atmospheric gases such as oxygen and moisture. Therefore the barrier properties of the vessel wall are crucial to the shelf life of the samples contained.

The traditional glass pharmaceutical packages or other vessels provide good barrier properties. However they are prone to breakage or sample degradation during manufacture, filling operations, shipping and use, which means that glass particulates may enter the samples. The presence of glass particles has led to many FDA Warning Letters and to product recalls.

As a result, some companies have turned to plastic pharmaceutical packages or other vessels, which provide greater dimensional tolerance and less breakage than glass. Several non-glass (e.g. plastic) pre-filled syringes have been described. WO 2011/117878 A1 discloses a polycarbonate syringe. WO 2009/099641 A2 discloses cyclic olefin polymer syringes. However, the use of plastic for primary pharmaceutical packaging remains limited due to its gas permeability: plastic allows small molecule gases, such as oxygen and water molecules, to permeate into (or out of) the article. The permeability of plastics to gases is significantly greater than that of glass. In many cases (as with oxygen-sensitive or moisture sensitive drugs), there is a need to improve the oxygen and water barrier properties for plastic vessels to be acceptable in pharmaceutical applications.

The problem of permeability has been addressed by adding a barrier coating or layer to the plastic pharmaceutical package where it contacts fluid contents of the package. One such barrier layer is a very thin coating of $SiO_x$, as defined below, applied by plasma enhanced chemical vapor deposition. But, an unprotected $SiO_x$ barrier layer deposited on a package by PECVD can be etched off by the sample contained in the package, particularly at higher pH values. This reduces the useful shelf life of the package as its oxygen and water barrier efficacy is reduced.

Cyclic Olefin Copolymer/Polymer (COC/COP) materials are relatively new thermoplastic materials with many desired properties. They are amorphous polyolefins, so they are transparent. They have low water absorption and good water barrier properties. In some cases, COP/COC may be good enough for storage of liquid solutions of drugs. In other cases, they do not provide the required water barrier properties. For example, some drugs which are supersensitive to water moisture are lyophilized for storage. Lyophilisation is a freezing-drying process which removes water from the drug after it is frozen and placed under vacuum. During the shelf life of a lyophilized drug, the supersensitive drug is stored in the container with a large vacuumed headspace in the container which would facilitate oxygen/water moisture permeation. Therefore containers for lyophilized drugs require extremely high oxygen and water moisture barrier properties. COP/COC alone cannot provide the required oxygen/water moisture barrier.

Teflon has been used as water barrier material. However, there are challenges to apply Teflon to pharmaceutical packages, vessels and containers. Teflon does not adhere well to vessel walls and is not transparent enough.

Definitions

In the context of the present invention, the following definitions and abbreviations are used:

RF is radio frequency.

The term "at least" in the context of the present invention means "equal or more" than the integer following the term. The word "comprising" does not exclude other elements or steps, and the indefinite article "a" or "an" does not exclude a plurality unless indicated otherwise. Whenever a parameter range is indicated, it is intended to disclose the parameter values given as limits of the range and all values of the parameter falling within said range.

"First" and "second" or similar references to, for example, deposits of lubricant, processing stations or processing devices refer to the minimum number of deposits, processing stations or devices that are present, but do not necessarily represent the order or total number of deposits, processing stations and devices or require additional deposits, processing stations and devices beyond the stated number. These terms do not limit the number of processing stations or the particular processing carried out at the respective stations. For example, a "first" deposit in the context of this specification can be either the only deposit or any one of plural deposits, without limitation. In other words, recitation of a "first" deposit allows but does not require an embodiment that also has a second or further deposit.

For purposes of the present invention, an "organosilicon precursor" is a compound having at least one of the linkages:

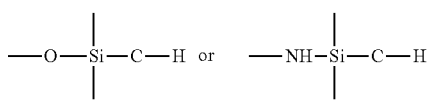

which is a tetravalent silicon atom connected to an oxygen or nitrogen atom and an organic carbon atom (an organic carbon atom being a carbon atom bonded to at least one hydrogen atom). A volatile organosilicon precursor, defined as such a precursor that can be supplied as a vapor in a PECVD apparatus, is an optional organosilicon precursor. Optionally, the organosilicon precursor is selected from the group consisting of a linear siloxane, a monocyclic siloxane, a polycyclic siloxane, a polysilsesquioxane, an alkyl trimethoxysilane, a linear silazane, a monocyclic silazane, a polycyclic silazane, a polysilsesquiazane, and a combination of any two or more of these precursors.

The feed amounts of PECVD precursors, gaseous reactant or process gases, and carrier gas are sometimes expressed in "standard volumes" in the specification and claims. The standard volume of a charge or other fixed amount of gas is the volume the fixed amount of the gas would occupy at a standard temperature and pressure (without regard to the actual temperature and pressure of delivery). Standard volumes can be measured using different units of volume, and still be within the scope of the present disclosure and claims. For example, the same fixed amount of gas could be expressed as the number of standard cubic centimeters, the number of standard cubic meters, or the number of standard cubic feet. Standard volumes can also be defined using different standard temperatures and pressures, and still be within the scope of the present disclosure and claims. For example, the standard temperature might be 0° C. and the standard pressure might be 760 Torr (as is conventional), or the standard temperature might be 20° C. and the standard pressure might be 1 Torr. But whatever standard is used in a given case, when comparing relative amounts of two or more different gases without specifying particular parameters, the same units of volume, standard temperature, and standard pressure are to be used relative to each gas, unless otherwise indicated.

The corresponding feed rates of PECVD precursors, gaseous reactant or process gases, and carrier gas are expressed in standard volumes per unit of time in the specification. For example, in the working examples the flow rates are expressed as standard cubic centimeters per minute, abbreviated as sccm. As with the other parameters, other units of time can be used, such as seconds or hours, but consistent parameters are to be used when comparing the flow rates of two or more gases, unless otherwise indicated.

A "vessel" in the context of the present invention can be any type of vessel with at least one opening and a wall defining an inner or interior surface. The substrate can be the wall of a vessel having a lumen. Though the invention is not necessarily limited to pharmaceutical packages or other vessels of a particular volume, pharmaceutical packages or other vessels are contemplated in which the lumen has a void volume of from 0.5 to 50 mL, optionally from 1 to 10 mL, optionally from 0.5 to 5 mL, optionally from 1 to 3 mL. The substrate surface can be part or all of the inner or interior surface of a vessel having at least one opening and an inner or interior surface. Some examples of a pharmaceutical package include, but are not limited to, a vial, a plastic-coated vial, a syringe, a plastic coated syringe, a blister pack, an ampoule, a plastic coated ampoule, a cartridge, a bottle, a plastic coated bottle, a pouch, a pump, a sprayer, a stopper, a needle, a plunger, a cap, a stent, a catheter or an implant.

The term "at least" in the context of the present invention means "equal or more" than the integer following the term. Thus, a vessel in the context of the present invention has one or more openings. One or two openings, like the openings of a sample tube (one opening) or a syringe barrel (two openings) are preferred. If the vessel has two openings, they can be of same or different size. If there is more than one opening, one opening can be used for the gas inlet for a PECVD coating method according to the present invention, while the other openings are either capped or open. A vessel according to the present invention can be a sample tube, for example for collecting or storing biological fluids like blood or urine, a syringe (or a part thereof, for example a syringe barrel) for storing or delivering a biologically active compound or composition, for example a medicament or pharmaceutical composition, a vial for storing biological materials or biologically active compounds or compositions, a pipe, for example a catheter for transporting biological materials or biologically active compounds or compositions, or a cuvette for holding fluids, for example for holding biological materials or biologically active compounds or compositions.

A vessel can be of any shape, a vessel having a substantially cylindrical wall adjacent to at least one of its open ends being preferred. Generally, the interior wall of the vessel is cylindrically shaped, like, for example in a sample tube or a syringe barrel. Sample tubes and syringes or their parts (for example syringe barrels) are contemplated.

A "hydrophobic layer" in the context of the present invention means that the coating or layer lowers the wetting tension of a surface coated with the coating or layer, compared to the corresponding uncoated surface. Hydrophobicity is thus a function of both the uncoated substrate and the coating or layer. The same applies with appropriate alterations for other contexts wherein the term "hydrophobic" is used. The term "hydrophilic" means the opposite, i.e. that the wetting tension is increased compared to reference sample. The present hydrophobic layers are primarily defined by their hydrophobicity and the process conditions providing hydrophobicity.

These values of w, x, y, and z are applicable to the empirical composition SiwOxCyHz throughout this specification. The values of w, x, y, and z used throughout this specification should be understood as ratios or an empirical formula (for example for a coating or layer), rather than as a limit on the number or type of atoms in a molecule. For example, octamethylcyclotetrasiloxane, which has the molecular composition Si4O4C8H24, can be described by the following empirical formula, arrived at by dividing each of w, x, y, and z in the molecular formula by 4, the largest common factor: Si1O1C2H6. The values of w, x, y, and z are also not limited to integers. For example, (acyclic) octamethyltrisiloxane, molecular composition Si3O2C8H24, is reducible to Si1O0.67C2.67H8. Also, although SiOxCyHz is described as equivalent to SiOxCy, it is not necessary to show the presence of hydrogen in any proportion to show the presence of SiOxCy.

BIF is defined as the ratio of the gas transmission rate through the uncoated substrate to the gas transmission rate through the coated substrate. For example, a BIF regarding water vapor transmission of a coated vessel is the ratio of WVTR (uncoated)/WVTR (coated).

"Water vapor barrier coating or layer (WVBC)" in the context of the current specification means that the coating lowers the water vapor transmission rate (WVTR) of the coated substrate compared to the uncoated substrate.

"Water vapor barrier coating or layer (WVBC)" is sometimes also referred to "water barrier coating or layer (WBC)". WVBC is exchangeable with WBC in this specification.

"Wetting tension" is a specific measure for the hydrophobicity or hydrophilicity of a surface. An optional wetting tension measurement method in the context of the present invention is ASTM D 2578 or a modification of the method described in ASTM D 2578. This method uses standard wetting tension solutions (called dyne solutions) to determine the solution that comes nearest to wetting a plastic film surface for exactly two seconds. This is the film's wetting tension. The procedure utilized is varied herein from ASTM D 2578 in that the substrates are not flat plastic films, but are tubes made according to the Protocol for Forming PET Tube and (except for controls) coated according to the Protocol for coating Tube Interior with Hydrophobic Coating or Layer (see Example 9 of EP2251671A2).

The atomic ratio can be determined by XPS. Taking into account the H atoms, which are not measured by XPS, the coating or layer may thus in one aspect have the formula SiwOxCyHz (or its equivalent SiOxCy), for example where w is 1, x is from about 0.5 to about 2.4, y is from about 0.6 to about 3, and z is from about 2 to about 9. Typically, such coating or layer would hence contain 36% to 41% carbon normalized to 100% carbon plus oxygen plus silicon.

The term "syringe" is broadly defined to include cartridges, injection "pens," and other types of barrels or reservoirs adapted to be assembled with one or more other components to provide a functional syringe. "Syringe" is also broadly defined to include related articles such as auto-injectors, which provide a mechanism for dispensing the contents.

A "trilayer coating or layer" refers to a coating set comprising a tie layer, a SiOx barrier coating and a pH protective layer.

A coating or layer or treatment is defined as "hydrophobic" if it lowers the wetting tension of a surface, compared to the corresponding uncoated or untreated surface. Hydrophobicity is thus a function of both the untreated substrate and the treatment.

The word "comprising" does not exclude other elements or steps.

The indefinite article "a" or "an" does not exclude a plurality.

SUMMARY

An aspect of the invention is a vessel having a lumen defined at least in part by a wall. The wall has an interior surface facing the lumen, an outer surface, and a plasma-enhanced chemical vapor deposition (PECVD) coating set supported by the wall. The PECVD coating set includes a water barrier coating and a gas barrier coating.

The water barrier coating or layer has a water contact angle from 80 to 180 degrees. It is applied using a water barrier coating or layer precursor comprising a saturated or unsaturated fluorocarbon precursor having from 1 to 6 carbon atoms, a saturated or unsaturated hydrocarbon having from 1 to 6 carbon atoms, a saturated or unsaturated hydrofluorocarbon having from 1 to 6 carbon atoms. Optionally, the precursor can include two or more of these precursors.

The gas barrier coating set includes an $SiO_x$, gas barrier coating or layer from 2 to 1000 nm thick, in which x is from 1.5 to 2.9 as measured by x-ray photoelectron spectroscopy (XPS). The gas barrier coating or layer has an interior surface facing the lumen and an outer surface facing the interior surface of the wall. The gas barrier coating or layer is effective to reduce the ingress of atmospheric gas into the lumen compared to a vessel without this gas barrier coating or layer.

Another aspect of the invention is a vessel having a lumen defined at least in part by a wall. The wall has an interior surface facing the lumen, an outer surface, and a plasma-enhanced chemical vapor deposition (PECVD) coating set supported by the wall. The PECVD coating set includes a water barrier coating.

The water barrier coating or layer has a water contact angle from 80 to 180 degrees. It is applied using a water barrier coating or layer precursor comprising a saturated or unsaturated fluorocarbon precursor having from 1 to 6 carbon atoms, a saturated or unsaturated hydrocarbon having from 1 to 6 carbon atoms, or a saturated or unsaturated hydrofluorocarbon having from 1 to 6 carbon atoms. Optionally, the precursor can include two or more of these precursors.

Yet another aspect of the invention is a method of making the vessel of any type described above. The method includes evacuating and feeding steps. The evacuating step is carried out by at least partially evacuating a region adjacent to a surface of the wall, forming a partially evacuated region. The water barrier precursor feeding step is carried out by feeding the water barrier coating or layer precursor to the partially evacuated region. Plasma is generated in the partially evacuated region, forming a water barrier coating or layer supported by the wall adjacent to the evacuated region.

Before or after the step of feeding the water barrier coating or layer precursor, another step is feeding a precursor gas for a first coating or layer of the gas barrier coating set to the partially evacuated region and generating plasma in the partially evacuated region, forming a coating or layer of a gas barrier coating set supported by the wall adjacent to the evacuated region.

Other aspects of the invention will be apparent from the description and claims following.

BRIEF DESCRIPTION OF DRAWING FIGURES

Figures 7, 8, 9:
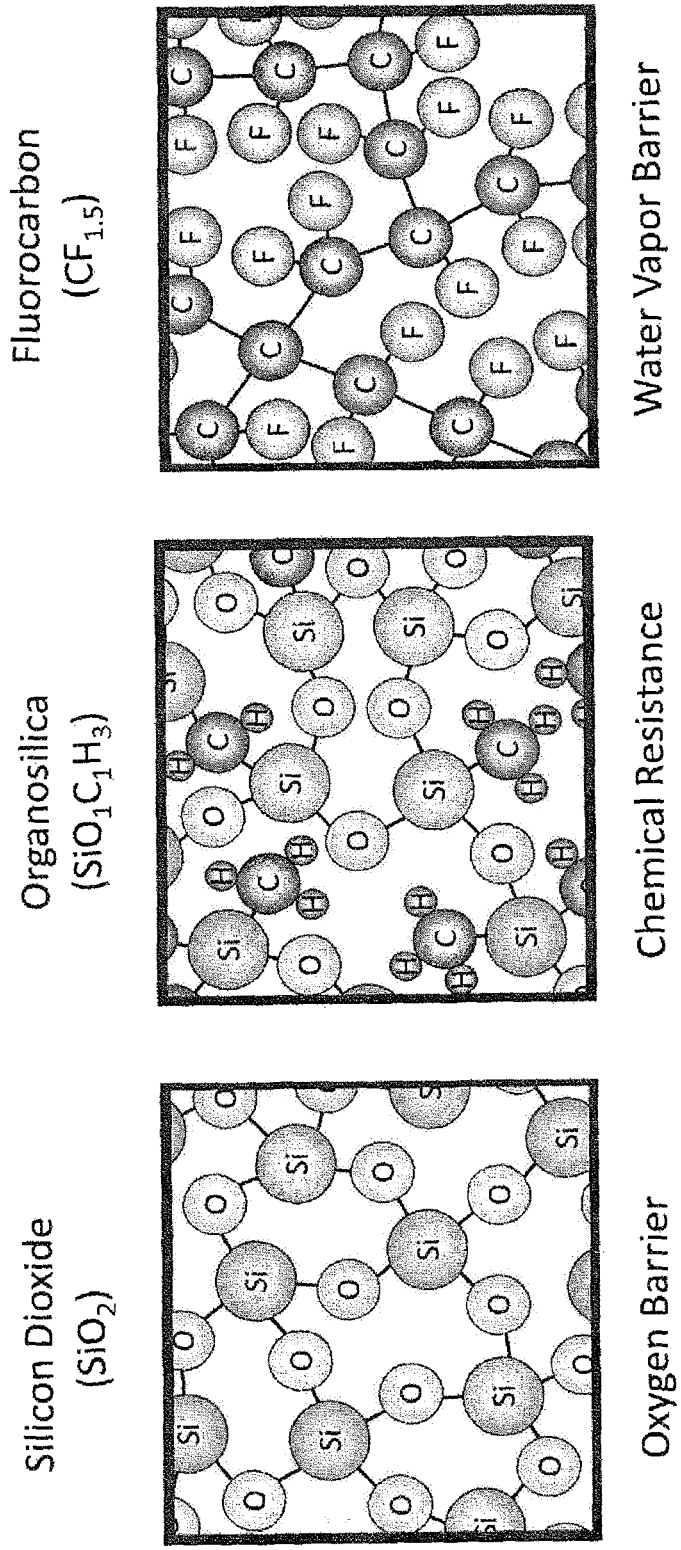
FIG. 7 is a schematic view of the typical atomic arrangement of silicon and oxygen expected in an $SiO_x$ PECVD coating in which x is about 2.

FIG. 8 is a view similar to FIG. 7 for an SiOxCyHz PECVD coating in which x is about 1, y is about 1, and z is about 3.

FIG. 9 is a view similar to FIG. 7 for a $CF_w$ coating in which w is about 1.5.

The following reference characters are used in the present specification and drawings.

| | |
|---|---|
| 101 | Vessel coater |
| 103 | Precursor source |
| 105 | Precursor source |
| 107 | Precursor source |
| 109 | Precursor source |
| 111 | Metering device |
| 113 | Metering device |
| 115 | Metering device |
| 117 | Metering device |
| 119 | Gas mixing chamber |
| 121 | Reactor inlet valve |
| 123 | Reactor chamber |
| 125 | Pressure controller |
| 127 | Reactor outlet valve |
| 129 | Vacuum line valve |
| 131 | Cold trap valve |
| 133 | Cold trap |
| 135 | Vacuum pump |
| 137 | Exhaust |
| 139 | Energy source |
| 141 | Electrode/gas conduit |
| 143 | Ground |
| 143a | Electrical ground (of 139) |
| 210 | Vessel |
| 212 | Lumen of 210 |
| 214 | Wall |
| 216 | Outer surface (of 214) |
| 220 | Interior surface (of 288) |
| 222 | Outer surface (of 288) |
| 224 | Interior surface (of 286) |
| 226 | Outer surface (of 286) |
| 262 | Closure |
| 278 | Interior surface (of 214) |
| 285 | Interior PECVD coatings |
| 286 | pH protective coating or layer |
| 288 | $Sio_x$ gas barrier coating or layer |
| 289 | Tie coating or layer |
| 291 | Interior surface (of 289) |
| 293 | Outer surface (of 289) |
| 298 | Gas barrier coating set |
| 300 | Water barrier coating or layer |
| 301 | External coating set |
| 302 | PECVD coating set |

DETAILED DESCRIPTION

Figure 1:
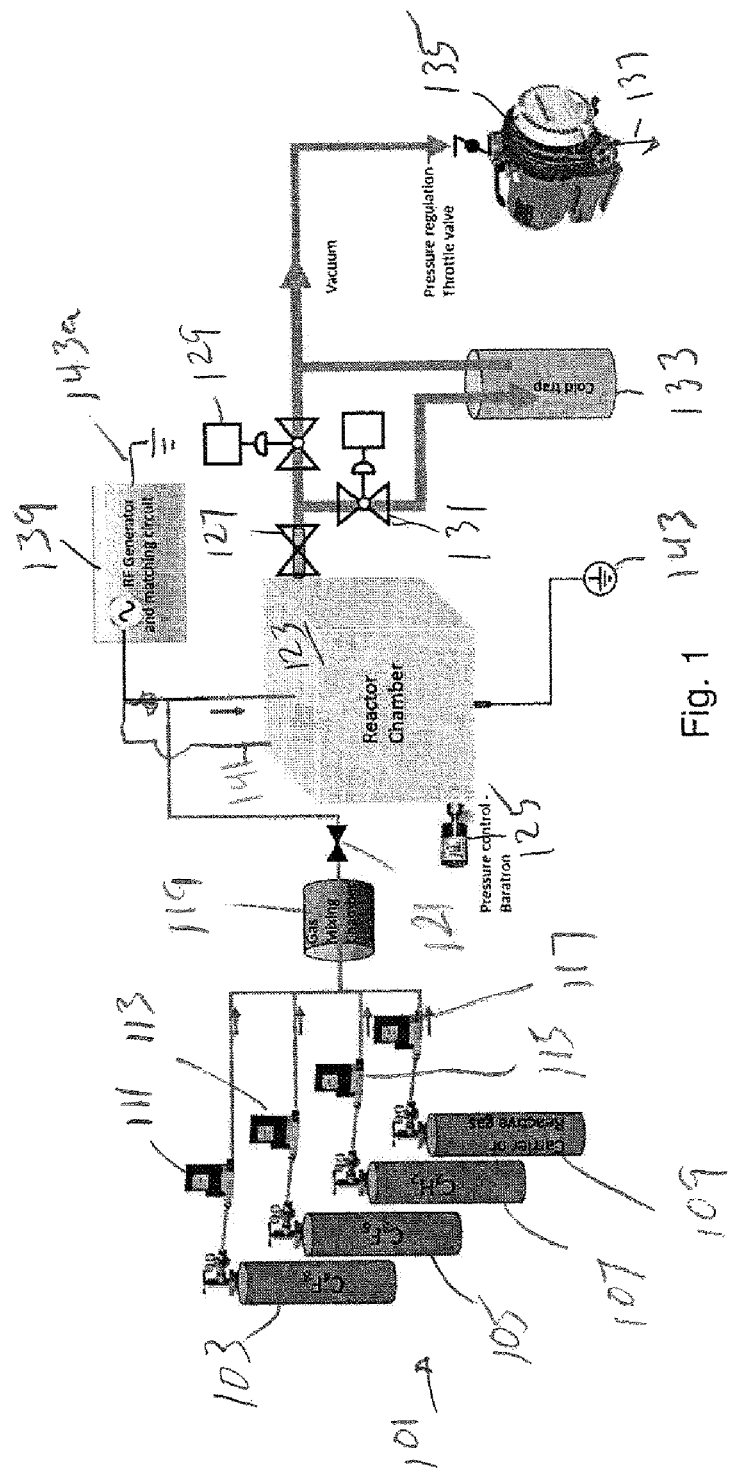
FIG. 1 is a schematic view of a coating system for applying plasma enhanced chemical vapor deposition (PECVD) coatings on a vessel or other substrate.
Figure 2:
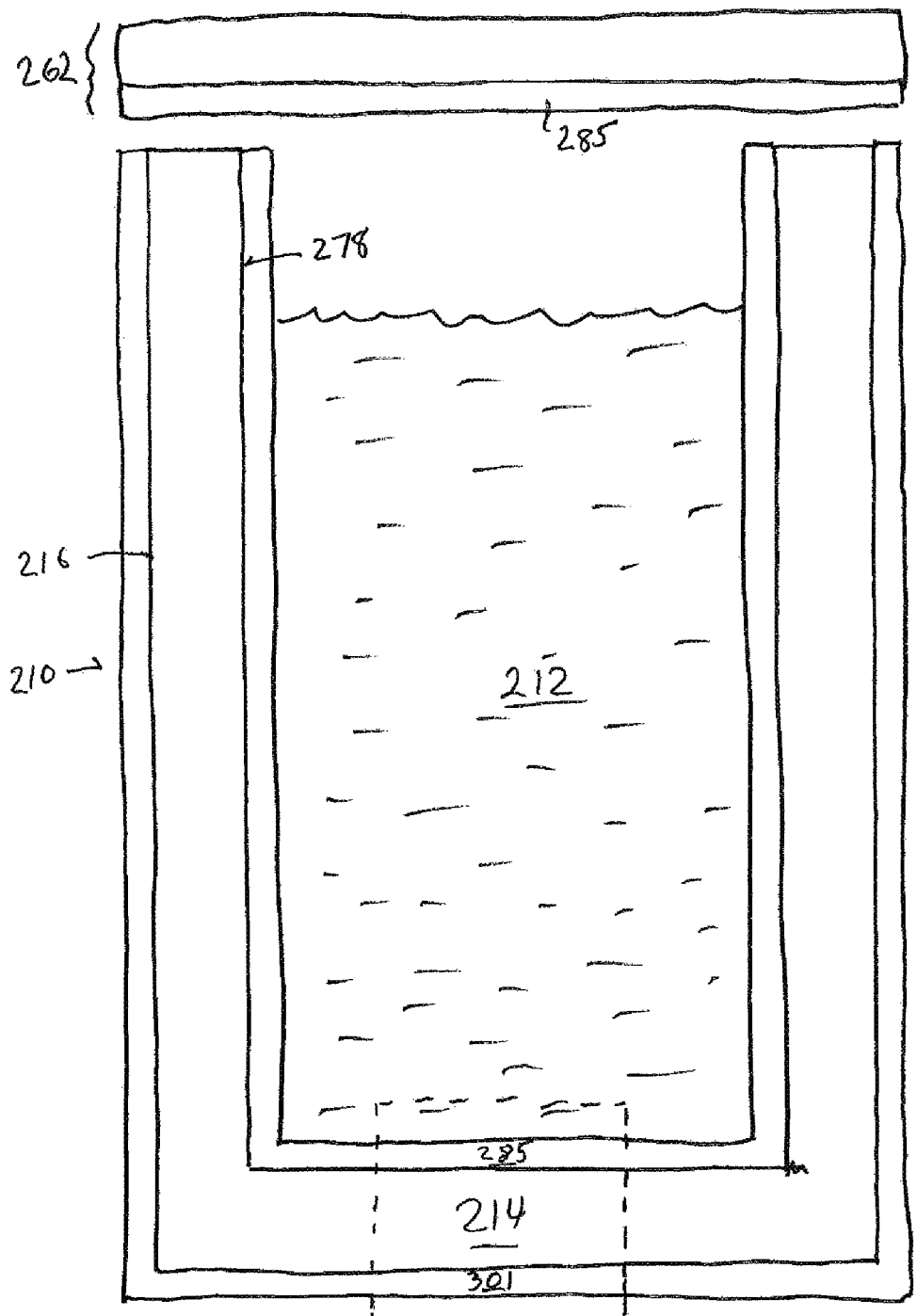
FIG. 2 is a schematic view of a PECVD coated vessel of any embodiment of the invention.
Figure 2A:
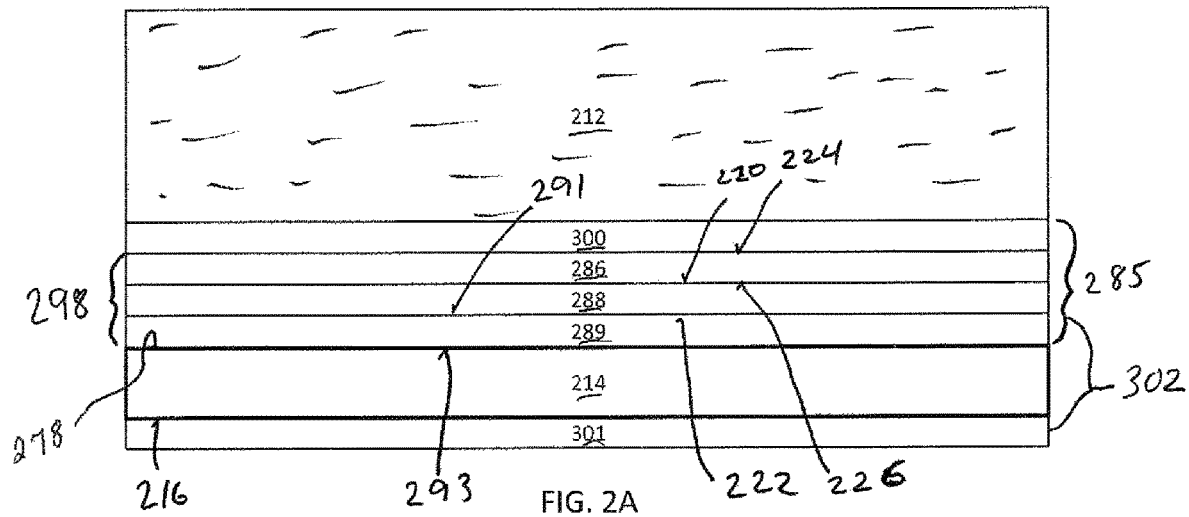
FIG. 2A is one alternative detail view of the vessel of FIG. 2.
Figure 2B:
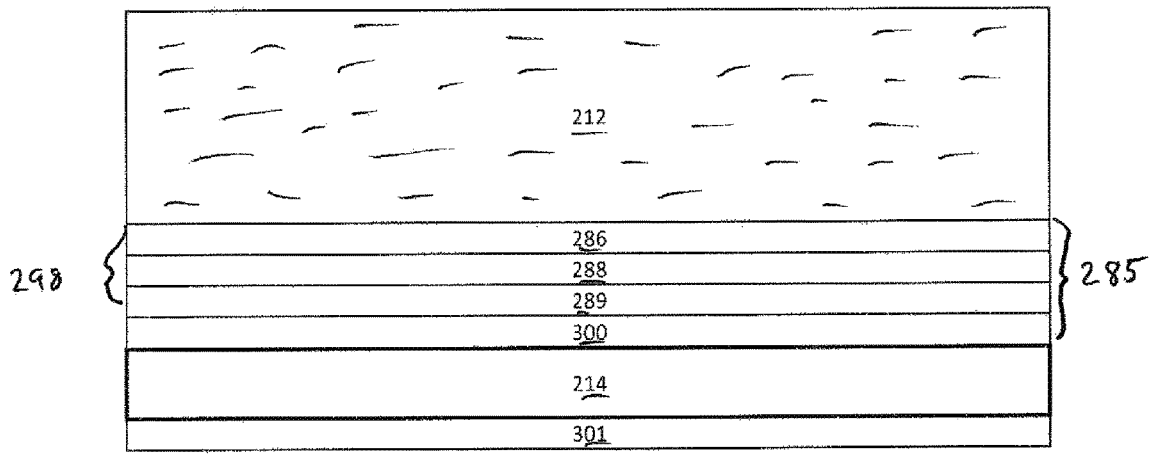
FIG. 2B is another alternative detail view of the vessel of FIG. 2.
Figure 3:
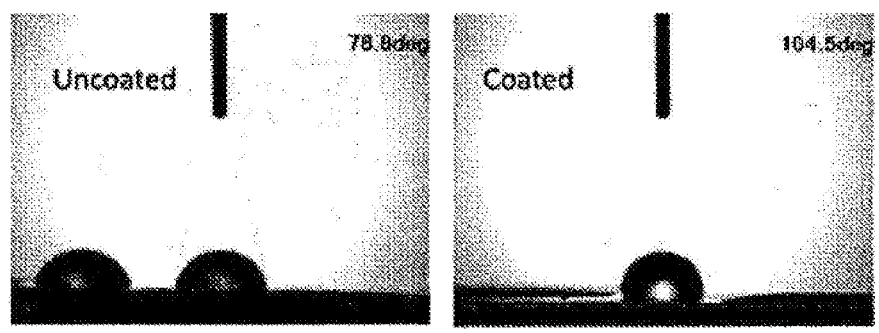
FIG. 3 is an illustration of two different water contact angles for water droplets on two different surfaces being evaluated for contact angle.

Referring to the drawings, FIG. 1 is a schematic view of a vessel coater 101 for processing vessels such as those represented schematically by FIGS. 2, 2A, and 2B. The coater 101 can be used, for example, to apply PECVD coatings as represented schematically by FIGS. 7, 8, and 9. The PECVD coating apparatus and process also can be as described generally in PECVD protocols of U.S. Pat. No. 7,985,188, International Application No. PCT/US2014/023813, or International Application No. PCT/US2016/047622. The entire text and drawings of U.S. Pat. No. 7,985,188, International Application No. PCT/US2014/023813 and International Application No. PCT/US2016/047622 are incorporated here by reference.

The vessel coater 101 includes gas sources such as 103, 105, 107, and 109 for any process gases to be used, which may be, for example, precursors, reactive gases, or carrier gases. The specific gas identities in FIG. 1 are representative; these particular gases need not all be present, and other gases not specifically illustrated can be used. Typically, each gas source has a metering device such as 111, 113, 115, and 117 for controlling the amount of each gas to be used for PECVD.

The gases to be used are mixed in the gas mixing chamber 119, then conveyed via a reactor inlet valve 121 into a reactor chamber. If the exterior of a vessel is to be coated, the reactor chamber 123 can be a separate chamber into which a workpiece to be coated is placed. If the interior of a vessel is to be coated, the reactor chamber 123 can be the lumen of the vessel to be coated, fitted with a gas inlet and gas outlet to convey gases to and from the lumen. Representative apparatus for coating the interior surfaces of a vessel is illustrated, for example, in U.S. Pat. No. 7,985,188, for example in FIG. 2 and the associated text of that patent. The reactor chamber can be fitted with a pressure controller 125 for maintaining the reaction pressure used for PECVD.

Effluent gas is produced in the reactor chamber 123 as the result of the coating process. The effluent gas is conveyed out of the reactor chamber 123 via a reactor outlet valve 127. Optionally, if one or more constituents of the effluent gases is to be trapped, the vacuum line valve 129 is closed, and a cold trap valve 131 is opened. This shunts the effluent gas to a cold trap 133 or other collection apparatus for collecting one or more constituents of the effluent, after which any contents exiting the cold trap 133 pass through the vacuum pump 135 to an exhaust 137. Alternatively, if the effluent gas is to be passed directly through the vacuum pump 135 without shunting and collecting effluent gas constituents, the cold trap valve 131 can be closed and the vacuum line valve 129 opened to pass the effluent from the reactor chamber 123 directly through the vacuum pump 135, then to the exhaust 137.

PECVD requires a source of energy to generate plasma, which in the illustrated apparatus is provided by the electromagnetic energy source 139. As illustrated, the energy source 139 is a radio frequency generator, generating RF energy, for example at 13.56 MHz, which is a frequency approved for PECVD. The energy source 139 can also or instead be a microwave generator, in which case the microwave energy conventionally is directed by a wave guide into the reactor chamber 123. Energy from the energy source 139 is in this embodiment conveyed into the reactor chamber 123 via an electrode 141 to a suitable applicator in or forming the wall of the reactor chamber 143. Alternatively, as illustrated in U.S. Pat. No. 7,985,188, for example in FIG. 2, a grounded, hollow, inner electrode is a hollow tube that conveys the process gases into the reactor chamber 123, and the live electrode is connected to an external applicator surrounding or adjacent to the reactor chamber 123.

Many different types of apparatus are known to the skilled person for carrying out PECVD. The present disclosure is not limited to any particular apparatus or method, except as otherwise expressly indicated in a particular aspect of this specification.

Referring now to FIGS. 2, 2A, and 2B, a PECVD-coated vessel 210 is shown having a lumen 212 defined at least in part by a wall 214. The wall 214 has an interior surface 278 facing the lumen 212, an outer surface 216, and a plasma-enhanced chemical vapor deposition (PECVD) coating set 302 supported by the wall 214. Optionally, the vessel 210 can have a closure, schematically illustrated as 262 in FIG.

2. The closure 262 optionally can include one or more coatings such as the coating set 285, which can be any of the coating sets or individual coatings provided in this specification.

The PECVD coating set 302 includes a water barrier coating or layer 300 having a water contact angle from 80 to 180 degrees, optionally from larger than 80 degrees to less than 180 degrees, optionally from 90 degrees to 160 degrees, optionally from 100 degrees to 150 degrees, optionally from 110 degrees to 150 degrees. The water barrier coating or layer 300 can be applied, for example, using a water barrier coating or layer 300 precursor comprising at least one of a saturated or unsaturated fluorocarbon precursor having from 1 to 6 carbon atoms, a saturated or unsaturated hydrocarbon having from 1 to 6 carbon atoms, and a saturated or unsaturated hydrofluorocarbon having from 1 to 6 carbon atoms.

The gas barrier coating set 298 optionally includes an SiOx gas barrier coating or layer 288 from 2 to 1000 nm thick, in which x is from 1.5 to 2.9 as measured by x-ray photoelectron spectroscopy (XPS), the gas barrier coating or layer 288 having an interior surface 220 facing the lumen 212 and an outer surface 222 facing the interior surface 278 of the wall 214, the gas barrier coating or layer 288 being effective to reduce the ingress of atmospheric gas into the lumen 212 compared to a vessel 210 without a gas barrier coating or layer 288.

Optionally in any embodiment, the respective coatings and layers can be variously ordered. For one example, illustrated in FIG. 2B, the water barrier coating or layer 300 can be located between the gas barrier coating set 298 and the interior surface 278 of the wall 214.

Optionally in any embodiment, the gas barrier coating set 298 further comprises a pH protective coating or layer 286 comprising $SiO_xC_y$ or $SiN_xC_y$ as measured by x-ray photoelectron spectroscopy (XPS), which does not measure hydrogen although it may be present, in which x is from about 0.5 to about 2.4 and y is from about 0.6 to about 3 as measured by XPS. The pH protective coating or layer 286 has an interior surface 224 that optionally faces the lumen 212 and an outer surface 226 optionally facing the interior surface 220 of the gas barrier coating or layer 288.

Optionally in any embodiment, the gas barrier coating set 298 further comprises a tie coating or layer 289 comprising SiOxCy or SiNxCy, in which x is from about 0.5 to about 2.4 and y is from about 0.6 to about 3 as measured by XPS. Optionally in any embodiment, the tie coating or layer 289 can have an interior surface 291 facing the gas barrier coating or layer 288 and an outer surface 293 facing the water barrier coating or layer 300.

Optionally in any embodiment, the tie coating or layer 289 is in direct contact with the wall 214, the barrier coating or layer 288 is in between the tie coating or layer 289 and the pH protective coating or layer 286; and the water barrier coating or layer 300 is applied on the interior surface 224 of the pH protective coating or layer 286.

Optionally in any embodiment, the water vapor transmission rate (WVTR) of the vessel 210 is lower than that of a corresponding vessel 210 without the gas barrier coating set 298.

Optionally in any embodiment, the water vapor transmission rate (WVTR) of the vessel 210 is lower than that of a corresponding vessel 210 without the water barrier coating or layer 300.

Optionally in any embodiment, the water contact angle of the coated surface is larger than that of the same vessel 210 coated with a water barrier coating or layer 300 only or a gas barrier coating set 298 only.

Optionally in any embodiment, the water barrier coating 300 is applied directly on the wall 214 and the gas barrier coating set 298 is applied on top of the water barrier coating 300; the gas barrier coating set 298 comprises an SiOx gas barrier coating or layer 288, a pH protective coating or layer 286, and a tie coating or layer 289; the tie coating or layer 289 is in direct contact with the water barrier coating 300; and the barrier coating or layer 288 is in between the tie coating or layer 289 and the pH protective coating or layer 286.

Optionally in any embodiment, the water barrier coating or layer 300 is on the outer surface 216 of the vessel wall 214 and the gas barrier coating set 298 is on the interior surface 278 of the vessel wall 214.

Optionally in any embodiment, the plasma-enhanced chemical vapor deposition (PECVD) coating set 302 includes a water barrier coating or layer 300 having a water contact angle from 80 to 180 degrees, optionally from larger than 80 degrees to less than 180 degrees, optionally from 90 degrees to 160 degrees, optionally from 100 degrees to 150 degrees, optionally from 110 degrees to 150 degrees.

Vessel

The vessel can be embodied in many different forms and should not be construed as limited to the embodiments set forth here. Rather, these embodiments are examples of the invention, which has the full scope indicated by the language of the claims.

Optionally in any embodiment, the vessel 210 can be, for example, a microplate, a centrifuge tube, a well plate, a microwell plate, a vial, a pipette, a bottle, a jar, a syringe, a cartridge, a flask, a cryovial, a blister package, an ampoule, an evacuated blood collection tube, a specimen tube, a chromatography vial, a cosmetic container, a medical diagnostic straw, a sample vial, an assay tube, a transfer pipette, a reagent container, rigid or flexible tubing, a Cobas® Liat® system vessel 210, or any vessel 210 defined in the specification or other claims. Optionally in any embodiment, the vessel 210 can have a lumen 212 which is generally cylindrical. Optionally in any embodiment, the lumen 212 can have an inner diameter, an inner axial length, and an aspect ratio of inner axial length to inner diameter from 1:1 to 20:1, optionally from 1:1 to 15:1, optionally from 1:1 to 10:1, optionally from 1:1 to 5:1, optionally from 1:1 to 3:1, optionally from 1:1 to 2:1, optionally from 2:1 to 20:1, optionally from 2:1 to 15:1, optionally from 2:1 to 10:1, optionally from 2:1 to 5:1, optionally from 2:1 to 3:1, optionally from 3:1 to 20:1, optionally from 3:1 to 15:1, optionally from 3:1 to 10:1, optionally from 3:1 to 5:1, optionally from 5:1 to 20:1, optionally from 5:1 to 15:1, optionally from 5:1 to 10:1, optionally from 10:1 to 20:1, optionally from 10:1 to 15:1, optionally from 15:1 to 20:1.

Optionally in any embodiment, at least a portion of the wall 214 comprises olefin polymer, polypropylene (PP), polyethylene (PE), cyclic olefin copolymer (COC), cyclic olefin polymer (COP), polymethylpentene, polystyrene, hydrogenated polystyrene, polycyclohexylethylene (PCHE), heteroatom-substituted hydrocarbon polymer, polyester, polyethylene terephthalate (PET), polyethylene naphthalate (PEN), polybutylene terephthalate (PBT), polyvinylidene chloride (PVdC), polyvinyl chloride (PVC), polycarbonate, polylactic acid, epoxy resin, nylon, polyurethane polyacrylonitrile, polyacrylonitrile (PAN), ionomeric resin, Surlyn® ionomeric resin, or any combination, composite or blend of any two or more of the above materials; optionally PET, COP or PP; optionally COP.

In at least one embodiment, the wall of the vessel is made of thermoplastic polymeric material, such as a polyester, polyethylene terephthalate (PET), polyethylene naphthalate (PEN); a polyolefin, cyclic olefin polymer (COP), cyclic olefin copolymer (COC), polypropylene (PP), or a polycarbonate. The wall may be made of multilayer cyclic olefin polymer (COP) or cyclic olefin copolymer (COC) resin with other resins sandwiched between them. The resins sandwiched may include EVOH, EVA, PET, Nylon or Saran; or any combination of them. Optionally in any embodiment, the wall 214 comprises polyethylene terephthalate (PET) with the water barrier coating 300 supported by the wall 214.

Optionally in any embodiment, the vessel 210 can contain a moisture sensitive material, optionally a lyophilized drug, a diagnostic reagent, or a topical tissue adhesive.

Optionally in any embodiment, the outer surface 216 of the vessel wall 214 can free of PECVD coatings. Alternatively, an external coating set 301 can be provided, which can include any or all of the interior layers, and optionally, as illustrated, can be a water barrier coating or layer, provided along with or instead of the interior water barrier coating or layer 300 illustrated in FIGS. 2A and 2B.

Water Barrier Coating or Layer

Optionally in any embodiment, the water barrier coating or layer 300 is from 1 nm to 500 nm thick, alternatively from 1 nm to 400 nm thick, alternatively from 1 nm to 300 nm thick, alternatively from 1 nm to 200 nm thick, alternatively from 1 nm to 100 nm thick, alternatively from 1 nm to 80 nm thick, alternatively from 1 nm to 60 nm thick, alternatively from 1 nm to 50 nm thick, alternatively from 1 nm to 40 nm thick, alternatively from 1 nm to 30 nm thick, alternatively from 1 nm to 20 nm thick, alternatively from 1 nm to 10 nm thick, alternatively from 1 nm to 5 nm thick, alternatively from 10 nm to 500 nm thick, alternatively from 10 nm to 400 nm thick, alternatively from 10 nm to 300 nm thick, alternatively from 10 nm to 200 nm thick, alternatively from 10 nm to 100 nm thick, alternatively from 10 nm to 80 nm thick, alternatively from 10 nm to 60 nm thick, alternatively from 10 nm to 50 nm thick, alternatively from 10 nm to 40 nm thick, alternatively from 10 nm to 30 nm thick, alternatively from 10 nm to 20 nm thick, alternatively from 1 nm to 10 nm thick, alternatively from 1 nm to 5 nm thick, alternatively from 50 nm to 500 nm thick, alternatively from 50 nm to 400 nm thick, alternatively from 50 nm to 300 nm thick, alternatively from 50 nm to 200 nm thick, alternatively from 50 nm to 100 nm thick, alternatively from 50 nm to 80 nm thick, alternatively from 50 nm to 60 nm thick, alternatively from 100 nm to 500 nm thick, alternatively from 100 nm to 400 nm thick, alternatively from 100 nm to 300 nm thick, alternatively from 100 nm to 200 nm thick.

Optionally in any embodiment, the water barrier coating or layer 300 is in direct contact with the wall 214.

Optionally in any embodiment, the water barrier coating or layer 300 is in direct contact with the interior surface 278 of the wall 214.

Optionally in any embodiment, the water barrier coating or layer 300 is in direct contact with the outer surface 216 of the wall 214.

Optionally in any embodiment, the water barrier coating or layer 300 is in direct contact with the outer surface 216 of the wall 214 and another identical or different said water barrier coating or layer 300 is in direct contact with the inner surface of the wall 214.

Optionally in any embodiment, the water vapor transmission barrier improvement factor (BIF) of the vessel 210 comprising the water barrier coating or layer 300, compared to the corresponding vessel 210 without the water barrier coating or layer 300, is larger than 1, optionally 2 to 8, optionally 4 to 8, optionally 6 to 8.

Optionally in any embodiment, the water vapor transmission rate (WVTR) of the vessel 210 is lower than that of a corresponding vessel 210 without the water barrier coating or layer 300.

Optionally in any embodiment, the vapor transmission barrier improvement factor (BIF) for at least one of water, dimethyl sulfoxide (DMSO), ethanol, or any combination of two or all of these, compared to the corresponding vessel 210 without the water barrier coating or layer 300, is larger than 1, optionally between 2 and 20, optionally between 4 and 20, optionally between 6 and 20, optionally between 8 and 20, optionally between 2 and 10, optionally between 4 and 10, optionally between 6 and 10, optionally between 8 and 10, optionally between 2 and 5, optionally between 4 and 5, optionally between 1.5 and 10, optionally between 1.5 and 8, optionally between 1.5 and 6, optionally between 1.5 and 4, optionally between 1.5 and 2.

The water barrier coating or layer of the invention is applied by PECVD using a coater, which optionally can be the coater described previously in connection with FIG. 1.

The coating precursors comprise fluorocarbons, hydrocarbons, or hydrofluorocarbons. The fluorocarbons can be fluorinated compounds, for example a saturated or unsaturated, linear or cyclic aliphatic fluorocarbon precursor having from 1 to 10, optionally 1 to 6, optionally 2 to 6 carbon atoms and from 4 to 20 fluorine atoms per molecule. Some specific examples of suitable fluorinated compounds include fluorinated gases such as hexafluoropropylene (C3F6), octafluorocyclobutane (C4F8), tetrafluoroethylene (C2F4), or hexafluoroethane (C2F6); optionally hexafluoropropylene (C3F6) or octafluorocyclobutane (C4F8); or fluorinated liquids, such as perfluoro-2-methyl-2-pentene (C6F12) or perfluorohexane (C6F14); or any combination thereof. The hydrocarbons can be lower alkanes having from 1 to 4 carbon atoms, alkenes or alkynes having from 2 to 4 carbon atoms, for example acetylene (C2H2) or methane (CH4); optionally acetylene (C2H2). The hydrofluorocarbon can be saturated or unsaturated, having from 1 to 6 carbon atoms, at least one hydrogen atom, and at least one fluorine atom per molecule, or any combination, composite, or blend of any two or more of the above materials.

The water barrier coating or layer of the invention is applied by PECVD using a coater, which optionally can be the coater described previously in connection with FIG. 1.

For the water barrier coating applied using fluorocarbons as the precursors, the typical coating process conditions are as follows:

Power frequency 13.56 MHz
Precursor: Hexafluoropropylene (C3F6) or Octafluorocyclobutane (C4F8)
Gas flow rate: 5-10 sccm
Carrier gas flow rate: 2-10 sccm
Base pressure 20-300 mTorr
Coating Pressure: 80-900 mTorr
Coating time: 5-30 s For the water barrier coating applied using hydrocarbons as the precursors, the typical coating process conditions are as follows:

Power frequency 13.56 MHz
Precursor: Acetylene (C2H2)
Gas flow rate 1-10 sccm

Carrier gas flow rate: 2-5 sccm
Base pressure 20-300 mTorr
Coating Pressure: 80-900 mTorr
Coating time: 5-30 s Optionally the inlet can be stationary or moving during the process.

The water barrier coating can be characterized using FT-IR, water contact angle, and XPS.

Tie Coating or Layer

The tie coating or layer 289 has at least two functions. One function of the tie coating or layer 289 is to improve adhesion of a barrier coating or layer 288 to a substrate, in particular a thermoplastic substrate, although a tie layer can be used to improve adhesion to a glass substrate or to another coating or layer. For example, a tie coating or layer, also referred to as an adhesion layer or coating can be applied to the substrate and the barrier layer can be applied to the adhesion layer to improve adhesion of the barrier layer or coating to the substrate.

Another function of the tie coating or layer 289 has been discovered: a tie coating or layer 289 applied under a barrier coating or layer 288 can improve the function of a pH protective coating or layer 286 applied over the barrier coating or layer 288.

The tie coating or layer 289 can be composed of, comprise, or consist essentially of SiOxCy, in which x is between 0.5 and 2.4 and y is between 0.6 and 3. Alternatively, the atomic ratio can be expressed as the formula SiwOxCy. The atomic ratios of Si, O, and C in the tie coating or layer 289 are, as several options:

Si 100:O 50-150:C 90-200 (i.e. w=1, x=0.5 to 1.5, y=0.9 to 2);
Si 100:O 70-130:C 90-200 (i.e. w=1, x=0.7 to 1.3, y=0.9 to 2)
Si 100:O 80-120:C 90-150 (i.e. w=1, x=0.8 to 1.2, y=0.9 to 1.5)
Si 100:O 90-120:C 90-140 (i.e. w=1, x=0.9 to 1.2, y=0.9 to 1.4), or
Si 100:O 92-107:C 116-133 (i.e. w=1, x=0.92 to 1.07, y=1.16 to 1.33)

The atomic ratio can be determined by XPS. Taking into account the H atoms, which are not measured by XPS, the tie coating or layer 289 may thus in one aspect have the formula SiwOxCyHz (or its equivalent SiOxCy), for example where w is 1, x is from about 0.5 to about 2.4, y is from about 0.6 to about 3, and z is from about 2 to about 9. Typically, tie coating or layer 289 would hence contain 36% to 41% carbon normalized to 100% carbon plus oxygen plus silicon.

Optionally, the tie coating or layer can be similar or identical in composition with the pH protective coating or layer 286 described elsewhere in this specification, although this is not a requirement.

The tie coating or layer 289 is contemplated in any embodiment generally to be from 5 nm to 100 nm thick, preferably from 5 to 20 nm thick, particularly if applied by chemical vapor deposition. These thicknesses are not critical. Commonly but not necessarily, the tie coating or layer 289 will be relatively thin, since its function is to change the surface properties of the substrate.

Barrier Layer

A barrier coating or layer 288 optionally can be deposited by plasma enhanced chemical vapor deposition (PECVD) or other chemical vapor deposition processes on the vessel of a pharmaceutical package, in particular a thermoplastic package, to prevent oxygen, carbon dioxide, or other gases from entering the vessel and/or to prevent leaching of the pharmaceutical material into or through the package wall.

The barrier coating or layer for any embodiment defined in this specification (unless otherwise specified in a particular instance) is a coating or layer, optionally applied by PECVD as indicated in U.S. Pat. No. 7,985,188, PCT/US2014/023813 or PCT/US16/47622. The barrier layer optionally is characterized as an "SiOx" coating, and contains silicon, oxygen, and optionally other elements, in which x, the ratio of oxygen to silicon atoms, is from about 1.5 to about 2.9, or 1.5 to about 2.6, or about 2. These alternative definitions of x apply to any use of the term SiOx in this specification. The barrier coating or layer is applied, for example to the interior of a pharmaceutical package or other vessel, for example, a cell culture flask, an Erlenmeyer cell culture flask, a cell culture vessel, a roller bottle, a ribbed roller bottle, a sample collection tube, a syringe barrel, a vial, or another type of vessel.

The barrier coating 288 comprises or consists essentially of SiOx, wherein x is from 1.5 to 2.9, from 2 to 1000 nm thick, the barrier coating 288 of SiOx having an interior surface facing the lumen 212 and an outer surface 222 facing the wall 214 article surface 254, the barrier coating 288 being effective to reduce the ingress of atmospheric gas into the lumen 212 compared to an uncoated vessel 250. One suitable barrier composition is one where x is 2.3, for example. For example, the barrier coating or layer such as 288 of any embodiment can be applied at a thickness of at least 2 nm, or at least 4 nm, or at least 7 nm, or at least 10 nm, or at least 20 nm, or at least 30 nm, or at least 40 nm, or at least 50 nm, or at least 100 nm, or at least 150 nm, or at least 200 nm, or at least 300 nm, or at least 400 nm, or at least 500 nm, or at least 600 nm, or at least 700 nm, or at least 800 nm, or at least 900 nm. The barrier coating or layer can be up to 1000 nm, or at most 900 nm, or at most 800 nm, or at most 700 nm, or at most 600 nm, or at most 500 nm, or at most 400 nm, or at most 300 nm, or at most 200 nm, or at most 100 nm, or at most 90 nm, or at most 80 nm, or at most 70 nm, or at most 60 nm, or at most 50 nm, or at most 40 nm, or at most 30 nm, or at most 20 nm, or at most 10 nm, or at most 5 nm thick. Ranges of 20-200 nm, optionally 20-30 nm, are contemplated. Specific thickness ranges composed of any one of the minimum thicknesses expressed above, plus any equal or greater one of the maximum thicknesses expressed above, are expressly contemplated.

The thickness of the SiOx or other barrier coating or layer can be measured, for example, by transmission electron microscopy (TEM), and its composition can be measured by X-ray photoelectron spectroscopy (XPS). The primer coating or layer described herein can be applied to a variety of pharmaceutical packages or other vessels made from plastic or glass, for example to plastic tubes, vials, and syringes.

A barrier coating or layer 288 of SiOx, in which x is between 1.5 and 2.9, is applied by plasma enhanced chemical vapor deposition (PECVD) directly or indirectly to the thermoplastic wall 214 (for example a tie coating or layer 289 can be interposed between them) so that in the filled pharmaceutical package or other vessel 210 the barrier coating or layer 288 is located between the inner or interior surface of the thermoplastic wall 214 and the fluid contained in the lumen.

The barrier coating or layer 288 of SiOx is supported by the thermoplastic wall 214. The barrier coating or layer 288 described elsewhere in this specification, or in U.S. Pat. No. 7,985,188, PCT/US2014/023813, or PCT/US16/47622, can be used in any embodiment.

Certain barrier coatings or layers 288 such as SiOx as defined here have been found to have the characteristic of being subject to being measurably diminished in barrier improvement factor in less than six months as a result of attack by certain relatively high pH contents of the coated vessel as described elsewhere in this specification, particularly where the barrier coating or layer directly contacts the contents. This issue can be addressed using a pH protective coating or layer as discussed in this specification.

The barrier coating or layer 288 of SiOx also can function as a primer coating or layer, as discussed elsewhere in this specification.

pH Protective Coating or Layer

The inventors have found that barrier layers or coatings of SiOx are eroded or dissolved by some fluids, for example aqueous compositions having a pH above about 5. Since coatings applied by chemical vapor deposition can be very thin—tens to hundreds of nanometers thick—even a relatively slow rate of erosion can remove or reduce the effectiveness of the barrier layer in less time than the desired shelf life of a product package. This is particularly a problem for fluid pharmaceutical compositions, since many of them have a pH of roughly 7, or more broadly in the range of 5 to 9, similar to the pH of blood and other human or animal fluids. The higher the pH of the pharmaceutical preparation, the more quickly it erodes or dissolves the SiOx coating. Optionally, this problem can be addressed by protecting the barrier coating or layer 288, or other pH sensitive material, with a pH protective coating or layer 286.

Optionally, the pH protective coating or layer 286 can be composed of, comprise, or consist essentially of SiwOxCyHz (or its equivalent SiOxCy) or SiwNxCyHz or its equivalent Si(NH)xCy), each as defined previously. The atomic ratio of Si:O:C or Si:N:C can be determined by XPS (X-ray photoelectron spectroscopy). Taking into account the H atoms, the pH protective coating or layer may thus in one aspect have the formula SiwOxCyHz, or its equivalent SiOxCy, for example where w is 1, x is from about 0.5 to about 2.4, y is from about to about 3, and z is from about 2 to about 9.

Typically, expressed as the formula SiwOxCy, the atomic ratios of Si, O, and C are, as several options:

Si 100:O 50-150:C 90-200 (i.e. w=1, x=0.5 to 1.5, y=0.9 to 2);

Si 100:O 70-130:C 90-200 (i.e. w=1, x=0.7 to 1.3, y=0.9 to 2)

Si 100:O 80-120:C 90-150 (i.e. w=1, x=0.8 to 1.2, y=0.9 to 1.5)

Si 100:O 90-120:C 90-140 (i.e. w=1, x=0.9 to 1.2, y=0.9 to 1.4)

Si 100:O 92-107:C 116-133 (i.e. w=1, x=0.92 to 1.07, y=1.16 to 1.33), or

Si 100:O 80-130:C 90-150.

Alternatively, the pH protective coating or layer can have atomic concentrations normalized to 100% carbon, oxygen, and silicon, as determined by X-ray photoelectron spectroscopy (XPS) of less than 50% carbon and more than 25% silicon. Alternatively, the atomic concentrations are from 25 to 45% carbon, 25 to 65% silicon, and 10 to 35% oxygen. Alternatively, the atomic concentrations are from 30 to 40% carbon, 32 to 52% silicon, and 20 to 27% oxygen. Alternatively, the atomic concentrations are from 33 to 37% carbon, 37 to 47% silicon, and 22 to 26% oxygen.

The thickness of the pH protective coating or layer can be, for example:

from 10 nm to 1000 nm;
alternatively from 10 nm to 1000 nm;
alternatively from 10 nm to 900 nm;
alternatively from 10 nm to 800 nm;
alternatively from 10 nm to 700 nm;
alternatively from 10 nm to 600 nm;
alternatively from 10 nm to 500 nm;
alternatively from 10 nm to 400 nm;
alternatively from 10 nm to 300 nm;
alternatively from 10 nm to 200 nm;
alternatively from 10 nm to 100 nm;
alternatively from 10 nm to 50 nm;
alternatively from 20 nm to 1000 nm;
alternatively from 50 nm to 1000 nm;
alternatively from 10 nm to 1000 nm;
alternatively from 50 nm to 800 nm;
alternatively from 100 nm to 700 nm;
alternatively from 300 to 600 nm.

Optionally, the atomic concentration of carbon in the protective layer, normalized to 100% of carbon, oxygen, and silicon, as determined by X-ray photoelectron spectroscopy (XPS), can be greater than the atomic concentration of carbon in the atomic formula for the organosilicon precursor. For example, embodiments are contemplated in which the atomic concentration of carbon increases by from 1 to 80 atomic percent, alternatively from 10 to 70 atomic percent, alternatively from 20 to 60 atomic percent, alternatively from 30 to 50 atomic percent, alternatively from 35 to 45 atomic percent, alternatively from 37 to 41 atomic percent.

Optionally, the atomic ratio of carbon to oxygen in the pH protective coating or layer can be increased in comparison to the organosilicon precursor, and/or the atomic ratio of oxygen to silicon can be decreased in comparison to the organosilicon precursor.

Optionally, the pH protective coating or layer can have an atomic concentration of silicon, normalized to 100% of carbon, oxygen, and silicon, as determined by X-ray photoelectron spectroscopy (XPS), less than the atomic concentration of silicon in the atomic formula for the feed gas. For example, embodiments are contemplated in which the atomic concentration of silicon decreases by from 1 to 80 atomic percent, alternatively by from 10 to 70 atomic percent, alternatively by from 20 to 60 atomic percent, alternatively by from 30 to 55 atomic percent, alternatively by from 40 to 50 atomic percent, alternatively by from 42 to 46 atomic percent.

As another option, a pH protective coating or layer is contemplated in any embodiment that can be characterized by a sum formula wherein the atomic ratio C:O can be increased and/or the atomic ratio Si:O can be decreased in comparison to the sum formula of the organosilicon precursor.

The pH protective coating or layer 286 commonly is located between the barrier coating or layer 288 and the fluid in the finished article. The pH protective coating or layer 286 is supported by the thermoplastic wall 214.

The pH protective coating or layer 286 optionally is effective to keep the barrier coating or layer 288 at least substantially undissolved as a result of attack by the fluid 218 for a period of at least six months.

The pH protective coating or layer can have a density between 1.25 and 1.65 g/cm3, alternatively between 1.35 and 1.55 g/cm3, alternatively between 1.4 and 1.5 g/cm3, alternatively between 1.4 and 1.5 g/cm3, alternatively between 1.44 and 1.48 g/cm3, as determined by X-ray reflectivity (XRR). Optionally, the organosilicon compound can be octamethylcyclotetrasiloxane and the pH protective coating or layer can have a density which can be higher than the density of a pH protective coating or layer made from HMDSO as the organosilicon compound under the same PECVD reaction conditions.

The pH protective coating or layer optionally can prevent or reduce the precipitation of a compound or component of a composition in contact with the pH protective coating or layer, in particular can prevent or reduce insulin precipitation or blood clotting, in comparison to the uncoated surface and/or to a barrier coated surface using HMDSO as precursor.

The pH protective coating or layer optionally can have an RMS surface roughness value (measured by AFM) of from about 5 to about 9, optionally from about 6 to about 8, optionally from about 6.4 to about 7.8. The Ra surface roughness value of the pH protective coating or layer, measured by AFM, can be from about 4 to about 6, optionally from about 4.6 to about 5.8. The Rmax surface roughness value of the pH protective coating or layer, measured by AFM, can be from about 70 to about 160, optionally from about 84 to about 142, optionally from about 90 to about 130.

The interior surface of the pH protective optionally can have a contact angle (with distilled water) of from 90° to 110°, optionally from 80° to 120°, optionally from 70° to 130°, as measured by Goniometer Angle measurement of a water droplet on the pH protective surface, per ASTM D7334-08 "Standard Practice for Surface Wettability of Coatings, Substrates and Pigments by Advancing Contact Angle Measurement."

The passivation layer or pH protective coating or layer 286 optionally shows an O-Parameter measured with attenuated total reflection (ATR) of less than 0.4, measured as:

$$\text{O-Parameter} = \frac{\text{Intensity at 1253 cm}-1}{\text{Maximum intensity in the range 1000 to 1100 cm}-1}.$$

Figure 5:
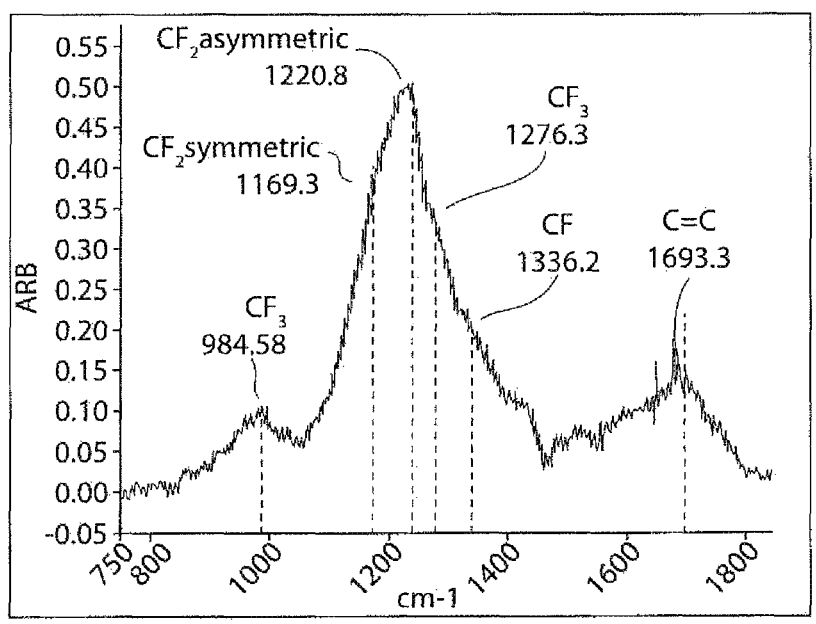
FIG. 5 is a plot showing FTIR peak values and assignments between 750 cm-1 and 1800 cm-1, with the peak strength presented in arbitrary units of absorbance for the PECVD water vapor barrier coating on the interior surface of a 10 mL COP vial, applied using C4F8 precursor mixed with Ar.
Figure 6:
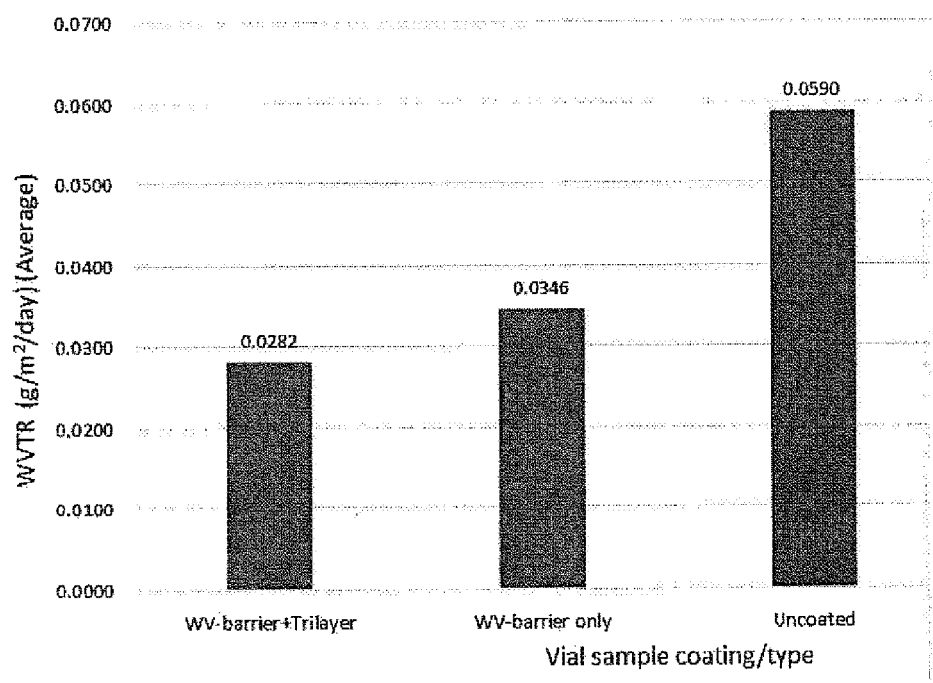
FIG. 6 is a plot of data corresponding to Example 4, showing water vapor transmittance values for several different PECVD coated vessels.

The O-Parameter is defined in U.S. Pat. No. 8,067,070, which claims an O-parameter value of most broadly from 0.4 to 0.9. It can be measured from physical analysis of an FTIR amplitude versus wave number plot to find the numerator and denominator of the above expression, as shown in FIG. 6, which is the same as FIG. 5 of U.S. Pat. No. 8,067,070, except annotated to show interpolation of the wave number and absorbance scales to arrive at an absorbance at 1253 cm-1 of 0.0424 and a maximum absorbance at 1000 to 1100 cm-1 of 0.08, resulting in a calculated O-parameter of 0.53. The O-Parameter can also be measured from digital wave number versus absorbance data.

U.S. Pat. No. 8,067,070 asserts that the claimed O-parameter range provides a superior pH protective coating or layer, relying on experiments only with HMDSO and HMDSN, which are both non-cyclic siloxanes. Surprisingly, it has been found by the present inventors that if the PECVD precursor is a cyclic siloxane, for example OMCTS, O-parameters outside the ranges claimed in U.S. Pat. No. 8,067,070, using OMCTS, provide even better results than are obtained in U.S. Pat. No. 8,067,070 with HMDSO.

Alternatively, in the embodiment, the O-parameter has a value of from 0.1 to 0.39, or from 0.15 to 0.37, or from 0.17 to 0.35.

Even another aspect of the invention is a composite material as just described, wherein the passivation layer shows an N-Parameter measured with attenuated total reflection (ATR) of less than 0.7, measured as:

$$\text{N-Parameter} = \frac{\text{Intensity at 840 cm}-1}{\text{Intensity at 799 cm}-1}.$$

The N-Parameter is also described in U.S. Pat. No. 8,067,070, and is measured analogously to the O-Parameter except that intensities at two specific wave numbers are used—neither of these wave numbers is a range. U.S. Pat. No. 8,067,070 claims a passivation layer with an N-Parameter of 0.7 to 1.6. Again, the present inventors have made better coatings employing a pH protective coating or layer 286 having an N-Parameter lower than 0.7, as described above. Alternatively, the N-parameter has a value of at least 0.3, or from 0.4 to 0.6, or at least 0.53.

The rate of erosion, dissolution, or leaching (different names for related concepts) of the pH protective coating or layer 286, if directly contacted by the fluid 218, is less than the rate of erosion of the barrier coating or layer 288, if directly contacted by the fluid 218.

The thickness of the pH protective coating or layer is contemplated in any embodiment to be from 50-500 nm, with a preferred range of 100-200 nm.

The pH protective coating or layer 286 is effective to isolate the fluid 218 from the barrier coating or layer 288, at least for sufficient time to allow the barrier coating to act as a barrier during the shelf life of the pharmaceutical package or other vessel 210.

The inventors have further found that certain pH protective coatings or layers of SiOxCy or Si(NH)xCy formed from polysiloxane precursors, which pH protective coatings or layers have a substantial organic component, do not erode quickly when exposed to fluids, and in fact erode or dissolve more slowly when the fluids have higher pHs within the range of 5 to 9. For example, at pH 8, the dissolution rate of a pH protective coating or layer made from the precursor octamethylcyclotetrasiloxane, or OMCTS, is quite slow. These pH protective coatings or layers of SiOxCy or Si(NH)xCy can therefore be used to cover a barrier layer of SiOx, retaining the benefits of the barrier layer by protecting it from the fluid in the pharmaceutical package. The protective layer is applied over at least a portion of the SiOx layer to protect the SiOx layer from contents stored in a vessel, where the contents otherwise would be in contact with the SiOx layer.

SiOxCy or Si(NH)xCy coatings also can be deposited from linear siloxane or linear silazane precursors, for example hexamethyldisiloxane (HMDSO) or tetramethyldisiloxane (TMDSO).

Optionally an FTIR absorbance spectrum of the pH protective coating or layer 286 of any embodiment has a ratio greater than 0.75 between the maximum amplitude of the Si—O—Si symmetrical stretch peak normally located between about 1000 and 1040 cm-1, and the maximum amplitude of the Si—O—Si assymetric stretch peak normally located between about 1060 and about 1100 cm-1. Alternatively, in any embodiment, this ratio can be at least 0.8, or at least 0.9, or at least 1.0, or at least 1.1, or at least 1.2. Alternatively, in any embodiment, this ratio can be at most 1.7, or at most 1.6, or at most 1.5, or at most 1.4, or at most 1.3. Any minimum ratio stated here can be combined with any maximum ratio stated here, as an alternative embodiment of the invention of FIGS. 1-7.

Optionally, in any embodiment the pH protective coating or layer 286, in the absence of the medicament, has a non-oily appearance. This appearance has been observed in some instances to distinguish an effective pH protective coating or layer from a lubricity layer, which in some instances has been observed to have an oily (i.e. shiny) appearance.

Optionally, for the pH protective coating or layer 286 in any embodiment the total silicon content of the pH protective coating or layer and barrier coating, upon dissolution into a test composition with a pH of 8 from the vessel, is less than 66 ppm, or less than 60 ppm, or less than 50 ppm, or less than 40 ppm, or less than 30 ppm, or less than 20 ppm.

Protocol with Plural Layers Coated in the Same Apparatus

Optionally in any embodiment, the tie or adhesion coating or layer, optionally the barrier coating or layer, optionally the pH protective layer, optionally the water barrier coating are applied in the same apparatus, without breaking vacuum between two or more coating steps, for example between the application of the adhesion coating or layer and the barrier coating or layer or, optionally, between the barrier coating or layer and the pH protective coating or layer, optionally between the pH protective coating and the water barrier coating. During the process, a partial vacuum is drawn in the lumen. While maintaining the partial vacuum unbroken in the lumen, a tie coating or layer of SiOxCy is applied by a tie PECVD coating process. The tie PECVD coating process is carried out by applying sufficient power to generate plasma within the lumen while feeding a gas suitable for forming the coating. The gas feed includes a linear siloxane precursor, optionally oxygen, and optionally an inert gas diluent. The values of x and y are as determined by X-ray photoelectron spectroscopy (XPS). Then, while maintaining the partial vacuum unbroken in the lumen, the plasma is extinguished. A tie coating or layer of SiOxCy, for which x is from about 0.5 to about 2.4 and y is from about 0.6 to about 3, is produced on the inside surface as a result.

Later during the process, while maintaining the partial vacuum unbroken in the lumen, a barrier coating or layer is applied by a barrier PECVD coating process. The barrier PECVD coating process is carried out by applying sufficient power to generate plasma within the lumen while feeding a gas. The gas feed includes a linear siloxane precursor and oxygen. A barrier coating or layer of SiOx, wherein x is from 1.5 to 2.9 as determined by XPS is produced between the tie coating or layer and the lumen as a result.

Then optionally, while maintaining the partial vacuum unbroken in the lumen, the plasma is extinguished.

Later, as a further option, a pH protective coating or layer of SiOxCy can be applied. In this formula as well, x is from about 0.5 to about 2.4 and y is from about 0.6 to about 3, each as determined by XPS. The pH protective coating or layer is optionally applied between the barrier coating or layer and the lumen, by a pH protective PECVD coating process. This process includes applying sufficient power to generate plasma within the lumen while feeding a gas including a linear siloxane precursor, optionally oxygen, and optionally an inert gas diluent.

Later during the process, while maintaining the partial vacuum unbroken, a water barrier coating or layer is applied by a water barrier coating PECVD process. The water barrier PECVD coating process is carried out by applying sufficient power to generate plasma while feeding a gas. The gas feed includes a fluorocarbon and/or hydrocarbon precursors. A water barrier coating or layer is produced on top of the pH protective coating as a result.

Optionally in any embodiment, the PECVD process for applying the tie coating or layer, the barrier coating or layer, or the pH protective coating or layer, or the water barrier coating or any combination of two or more of these, is carried out by applying pulsed power (alternatively the same concept is referred to in this specification as "energy") to generate plasma within the lumen.

Alternatively, the tie PECVD coating process, or the barrier PECVD coating process, or the pH protective PECVD coating process, or the water barrier coating, or any combination of two or more of these, can be carried out by applying continuous power to generate plasma within the lumen.

Optionally, a magnetic field can be applied adjacent to the vessel while applying the electromagnetic energy, optionally for the entire applying step. The magnetic field is applied under conditions effective to reduce the standard deviation of the mean thickness of the gas barrier coating on the generally cylindrical inner surface. The application of a magnetic field may improve the coating uniformity. The related apparatus and methods can be found in WO2014085348A2. WO2014085348A2 is incorporated here by reference in their entirety.

Trilayer Coating Parameters

Examples of specific coating parameters that have been used for a 1 mL vessel and 5 mL vial are shown in the PECVD Trilayer Process Specific Parameters Tables 2 (1 mL vial) and 3 (5 mL vial).

PECVD Trilayer Process
Specific Parameters Table 2 (1 mL vessel)

| Parameter | Units | Tie | Barrier | Protection |
|---|---|---|---|---|
| Power | W | 70 | 140 | 70 |
| TMDSO Flow | sccm | 4 | None | 4 |
| HMDSO Flow | sccm | None | 1.56 | None |
| $O_2$ Flow | sccm | 2 | 20 | 2 |
| Argon Flow | sccm | 80 | 0 | 80 |
| Ramp Time | seconds | None | None | None |
| Deposition Time | seconds | 2.5 | 20 | 10 |
| Tube Pressure | Torr | 1 | 0.59 | 1 |

PECVD Trilayer Process
Specific Parameters Table 3 (5 mL vial)

| Parameter | Units | Adhesion | Barrier | Protection |
|---|---|---|---|---|
| Power | W | 20 | 40 | 20 |
| TMDSO Flow | sccm | 2 | 0 | 2 |
| HMDSO Flow | sccm | 0 | 3 | 0 |
| $O_2$ Flow | sccm | 1 | 50 | 1 |
| Argon Flow | sccm | 20 | 0 | 20 |
| Ramp Time | seconds | 0 | 2 | 2 |
| Deposition Time | seconds | 2.5 | 10 | 10 |
| Tube Pressure | Torr | 0.85 | 1.29 | 0.85 |

The O-parameter and N-parameter values for the pH protective coating or layer applied to the 1 mL vessel as described above are 0.34 and 0.55, respectively.

The O-parameter and N-parameter values for the pH protective coating or layer applied to the 5 mL vessel are 0.24 and 0.63, respectively.

To carry out the process, a vessel 210 is provided including a wall 214 consisting essentially of thermoplastic polymeric material defining a lumen 212. Optionally in any embodiment, the wall includes a polyester, polyethylene terephthalate (PET), polyethylene naphthalate (PEN); a polyolefin, cyclic olefin polymer (COP), cyclic olefin copolymer (COC), polypropylene (PP), or a polycarbonate, preferably COP. Optionally in any embodiment, the vessel lumen has a capacity of from 2 to 12 mL, optionally from 3 to 5 mL, optionally from 8 to 10 mL.

The wall 214 has an inside surface facing the lumen and an outside surface.

A partial vacuum is drawn in the lumen. While maintaining the partial vacuum unbroken in the lumen, the tie coating or layer 289 of SiOxCy is applied by a tie PECVD process comprising applying sufficient power (alternatively the same concept is referred to in this specification as "energy") to generate plasma within the lumen while feeding a gas comprising a linear siloxane precursor, optionally oxygen, and optionally an inert gas diluent. The values of x and y are as determined by X-ray photoelectron spectroscopy (XPS).

Then, while maintaining the partial vacuum unbroken in the lumen, the plasma is extinguished, which has the effect of stopping application of the tie coating or layer of SiOxCy. Optionally in any embodiment, after the plasma used in the tie PECVD coating process is extinguished and before the barrier PECVD coating process is commenced, the feed of the gas employed in the tie PECVD coating process can be stopped. A tie coating or layer of SiOxCy, for which x is from about 0.5 to about 2.4 and y is from about 0.6 to about 3, is produced on the inside surface as a result.

Later during the process, while still maintaining the partial vacuum unbroken in the lumen, the barrier coating or layer 288 is applied by a barrier PECVD process comprising applying sufficient power (alternatively the same concept is referred to in this specification as "energy") to generate plasma within the lumen while feeding a gas comprising a linear siloxane precursor and oxygen.

Optionally in any embodiment, the power provided to generate plasma within the lumen for applying the barrier coating or layer in a 1-Up coater is from 30 to 80 watts, optionally from 40 to 80 watts, optionally from 50 to 80 watts, optionally from 55 to 65 watts, or optionally in a 4-Up coater is from 175 to 200 watts, optionally from 180 to 190 watts.

Optionally in any embodiment, the plasma generated for applying the barrier coating or layer is applied for 12 to 20 seconds, optionally for 15 to 20 seconds.

Optionally in any embodiment, the barrier coating or layer is applied using a siloxane precursor feed rate, optionally of HMDSO, of from 0.5 to 2 sccm, optionally 0.7 to 1.3 sccm.

Optionally in any embodiment, the barrier coating or layer is applied using a pressure of from 0.5 to 3.5 Torr, optionally from 1 to 2.5 Torr.

Optionally after applying the barrier coating or layer, while maintaining the partial vacuum unbroken in the lumen, the plasma is extinguished, which has the effect of stopping application of the barrier coating or layer. Optionally in any embodiment, after the plasma used in the barrier PECVD coating process is extinguished and before the optional pH protective PECVD coating process, if used, is commenced, the feed of the gas employed in the barrier PECVD coating process can be stopped. A barrier coating or layer of SiOx, wherein x is from 1.5 to 2.9 as determined by XPS is produced between the tie coating or layer and the lumen as a result of barrier coating.

Then optionally, while maintaining the partial vacuum unbroken in the lumen, the pH protective coating or layer 286 of SiOxCy is later applied by a pH protective PECVD process. In this formula, x is from about 0.5 to about 2.4 and y is from about 0.6 to about 3, each as determined by XPS. The pH protective coating or layer is optionally applied between the barrier coating or layer and the lumen, by a pH protective PECVD coating process. The pH protective PECVD process comprises applying sufficient power (alternatively the same concept is referred to in this specification as "energy") to generate plasma within the lumen while feeding a gas comprising a linear siloxane precursor, optionally oxygen, and optionally an inert gas diluent.

Surprisingly, as a result of this processing, the coated vessel 210 made by this process has a lower gas permeation rate constant into the lumen than a corresponding vessel 210 made by the same process except breaking the partial vacuum in the lumen between applying the tie coating or layer and applying the barrier coating or layer.

Surprisingly, as a result of this processing, the coated vessel 210 made by this process has a lower gas permeation rate constant into the lumen than a corresponding vessel 210 made by the same process except breaking the partial vacuum in the lumen between applying the tie coating or layer and applying the barrier coating or layer.

Alternatively, the coated vessel made by this process including the optional steps has a lower gas permeation rate constant into the lumen than a corresponding vessel made by the same process except breaking the partial vacuum in the lumen between applying the tie coating or layer and applying the barrier coating or layer, and also breaking the partial vacuum in the lumen between applying the barrier coating or layer and the pH protective coating or layer. Optionally in any embodiment, the coated vessel 210 has an oxygen permeation rate constant (OPRC) of from 0.002 to 0.1, optionally from 0.01 to 0.1, optionally from 0.14 to 0.05, optionally from 0.002 to 0.02, optionally from 0.003 to 0.12 μmol/day/cm2/atm.

Another example of this process is coating a 6 mL COP vial. The trilayer coating as described in this embodiment of the invention is applied by adjusting the flows of a single organosilicon monomer (e.g. HMDSO) and oxygen and also varying the PECVD generating power between each layer (without breaking vacuum between any two layers).

A 6 mL COP vial is placed on a vessel holder, sealed, and a vacuum is pulled within the vessel. Vials are used to facilitate storage while containing fluid as indicated below. Proportional results are contemplated if blood sample collection tubes are used. After pulling vacuum, the gas feed of precursor, oxygen, and argon is introduced, then at the end of the "plasma delay" continuous (i.e. not pulsed) RF power at 13.56 MHz is turned on to form the tie coating or layer. Then power is turned off, gas flows are adjusted, and after the plasma delay power is turned on for the second layer—an SiOx barrier coating or layer. This is then repeated for a third layer before the gases are cut off, the vacuum seal is broken, and the vessel is removed from the vessel holder. The layers are put down in the order of Tie layer, then Barrier layer, then pH Protective layer. An example of process settings is as shown in the following table.

| Coating | O$_2$ (sccm) | Ar (sccm) | HMDSO (sccm) | Power (W) | Deposition Time (sec) |
|---|---|---|---|---|---|
| Tie | 1 | 40 | 2 | 20 | 2.5 |
| Barrier | 100 | 0 | 1 | 60 | 15 |
| pH Protective | 1 | 40 | 2 | 20 | 10 |

In many applications, the thermoplastic wall of the container needs to be a barrier to both water vapor and atmospheric gas including oxygen/nitrogen gases. However, creating a barrier for water vapor on a polymer substrate is different from creating a barrier for oxygen or nitrogen.

The water vapor barrier coating of the current invention which is prepared using fluorocarbon/hydrocarbon precursors is different from the coatings of SiOx and SiOxCy which are mainly O2/N2 barrier, but much less effective as a water vapor barrier. SiOx is more frequently used for O2 gas barrier coating.

Water molecules are polar molecules while the atmospheric gas permeants such as oxygen and nitrogen molecules are nonpolar. Polar molecules such as water molecules attract other polar molecules through dipole-dipole interactions, particularly hydrogen bonding. The hydrogen bonding between water molecules and the oxygen-containing species within SiOx/SiOxCy coating makes the permeation of water molecules into these coatings easier. Oxygen and nitrogen molecules are nonpolar molecules which don't interact with these types of coatings. This could be the reason that SiOx/SiOxCy coatings are good barriers for O2, but not effective for water vapor.

Not limited by the theory, the water vapor barrier coating of the current invention doesn't contain an oxygen atom to form a strong hydrogen bonding with the water molecule which facilitates the permeation of water molecule through the coating. The highly nonpolar chemical groups within the water vapor barrier coating repels the water molecules by hydrophobic interactions that restricts their ability to permeate. Therefore, compared to SiOx/SiOxCy coating, the water vapor barrier coating presents higher water vapor barrier properties.

The current invention provides an article with water barrier surface and also an article with both water barrier and oxygen barrier properties at the same time. For example, PET presents excellent O2 barrier properties but weak water vapor barrier properties. A bloodtube made of PET coated with the water vapor barrier coating of the current invention presents high water vapor barrier properties.

Testing Protocol for Water Vapor Transmission Rate

The procedure described here is used to assess moisture ingress for any vessel or package that is capable of being sealed.

Tools and Equipment
Desiccant (or material under evaluation)
Crimper/Aluminum Crimps/Plungers/Stoppers
Environmental Chamber
Vials or Syringes
Analytical balance
Nitrile Gloves
Procedures
Label directly onto container using a Sharpie permanent marker.
Place desiccant or material under evaluation into each container.
Seal the container.
Weigh the containers on at least a 4 place balance and record the weight as time 0.
Put the weighed containers in an appropriate environmental chamber.
Remove the containers from the environmental chamber at the times specified in the testing instructions/protocol/DB.
Allow containers to equilibrate to room temperature for at least 10 minutes unless otherwise specified in the protocol/DB/testing instructions.
Weigh the containers and record the weight according to the time point.
Return the containers to the environmental chamber.
Calculate amount of water inside the container by subtracting the container initial weight from the final weight and converting to milligrams.
Calculate the rate of moisture ingress as the weight divided by the number of days of containment in the environmental chamber.

EXAMPLES

Example 1

Contact Angles on Polypropylene Surface Coated with Water Barrier Coating

This experiment was conducted to evaluate how the water barrier coating of the current application affects the water contact angle of a polymer surface. Eight polypropylene flat sheet samples were provided. All the samples were coated with the water barrier coating according to the protocol as described in this specification. The coating precursor was C4F8 and mixed with Ar gas.

After the coating was completed, the value of water contact angle was obtained for each sample surface by Goniometer Angle measurement of a water droplet on the sample surface, per ASTM D7334-08 "Standard Practice for Surface Wettability of Coatings, Substrates and Pigments by Advancing Contact Angle Measurement.". The results are shown in the following Table and the images are displayed in FIG. 3. The results show that the water barrier coated surface had a consistently larger water contact angle than uncoated surface.

In this example, the uncoated polymer surface presented a contact angle <90 degree, therefore water will wet the surface and spread over it. The water barrier coating of the water barrier coating increased the contact angle of the surface to an angle >90 degree, therefore water will stay on the coated surface as a bead and not spread over the surface. This may help lower the water vapour transmission rate of the vessel.

TABLE

Contact angles for polypropylene flat sheet coated with water barrier coating

| Sample | Contact Angle (degree) | Standard Deviation (degree) |
|---|---|---|
| Uncoated | 83.5 | 5.2 |
| Uncoated | 80.3 | 6.6 |
| 1 | 93 | 1 |
| 2 | 89.6 | 1.3 |
| 3 | 97.8 | 1.8 |
| 4 | 95.6 | 2.4 |
| 5 | 95.4 | 4.4 |
| 6 | 98 | 2.3 |
| 7 | 96 | 4.2 |
| 8 | 100 | 4 |

Example 2

Comparison of FTIR Spectra of Uncoated and Water Barrier Coating Coated External Surface of Polypropylene Tubes A polypropylene tube A was coated with water barrier coating of the current invention on its external surface according to the method described in the section of Water Barrier Coating wherein the precursor used was C4F8. Another polypropylene tube B was coated with water barrier coating of the current invention on its external surface according to the method described in the section of Water Barrier Coating wherein the precursor used was C3F6. After the completion of the coatings, FTIR spectra were taken on the external surfaces of an uncoated polypropylene tube (C), a water barrier coating coated polypropylene tube using C4F8 as a precursor (A) and a water barrier coating coated polypropylene tube using C3F6 as a precursor (B). The three FTIR are displayed in FIG. 4. The FTIR spectra clearly show that the uncoated surface and the water barrier coatings of the current invention coated surfaces are distinctively different.

Example 3

Figure 4:
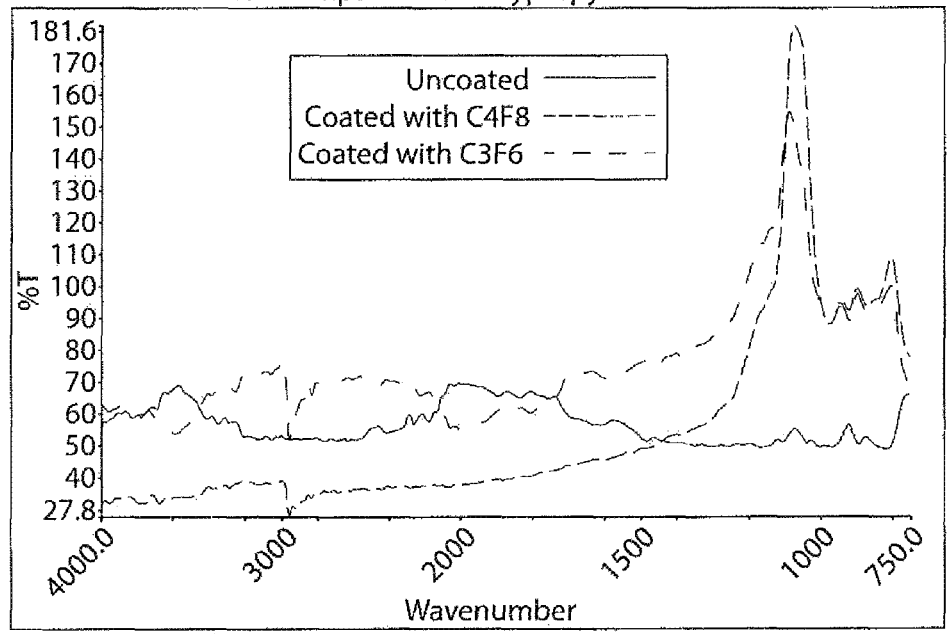
FIG. 4 is a Fourier-Transform infrared spectrophotometry (FTIR) plot of wave number vs. transmittance for polypropylene tubes, respectively uncoated, PECVD coated using a $C_4F_8$ precursor, and PECVD coated using a $C_3F_6$ precursor.

FTIR Spectrum of Water Barrier Coating on the Interior Surface of a 10 mL COP Vial A 10 mL COP vial was coated with water barrier coating of the current invention on its interior surface according to the method described in this specification, wherein the precursor used was C4F8. The coating parameters were as follows:
Power frequency 13.56 MHz
Precursor: Octafluorocyclobutane (C4F8)
Gas flow rate: 5 sccm
Carrier gas flow rate: 10 sccm
Base pressure 20 mTorr
Coating Pressure: 90 mTorr
Coating time: 5 s After the coating was completed, an FTIR spectrum was obtained for the coated surface. The FTIR spectra are shown in FIG. 4 and peak values and assignments are shown in FIG. 5.

Example 4

Water Vapor Transmission Rate (WVTR) Study of Water Vapor Barrier Coating (WVBC) and Additive Effect of Water Vapor Barrier Coating and Trilayer Coating This experiment was conducted to evaluate the water vapor transmission rate and the cumulative effect of the water vapor barrier coating and the trilayer coating.

Three batches of vessels, each including 200 COP vials, were provided. The vials of the first batch were coated on their interior surfaces with a water vapor barrier coating only, according to the method described in this specification, wherein the precursor used was C4F8. The coating parameters are as follows:
Power frequency 13.56 MHz
Precursor: Octafluorocyclobutane (C4F8)
Gas flow rate: 5 sccm
Carrier gas flow rate: 10 sccm
Base pressure 20 mTorr
Coating Pressure: 90 mTorr
Coating time: 5 s.

The vials of the second batch were not coated. The vials of the third batch were coated on their interior surface with a water vapor barrier coating and then a trilayer coating on top of the water vapor barrier coating, using the same method as described for the water vapor barrier coating and trilayer coating in this specification.

After the coating was complete, WVTR was measured for each vial. The vials were tested as whole articles, with crimped stoppers, in accordance to the USP Physical Tests, specifically USP general chapter <671> "Containers-Performance Testing", and more specifically section "Moisture Vapor Transmission Test Methods for Packaging Systems". Average values for WVTR and BIF for each batch of the vials were calculated. The calculated average WVTR and BIF results are shown in the following table and FIG. 6. The results demonstrate: 1) the vessels coated with the water vapor barrier coating of the current invention afford lower WVTR than the uncoated vessels; 2) the vessels coated with the water vapor barrier coating and the trilayer coating, with the trilayer coating on top of the water vapor barrier coating, have lower WVTR than the vessels coated with water vapor barrier coating only. The BIF for the vessel coated with both water vapor barrier coating and the trilayer coating is better than that of the vessel coated with water vapor barrier coating only. The additive effect between the water vapor barrier coating and the trilayer coating is a surprising discovery, since typically the trilayer coating has little effect on the WVTR.

TABLE

WVTR values and BIFs for Vials

|  | Uncoated | WVBC Coated | WVBC + Trilayer Coated |
|---|---|---|---|
| WVTR | 0.059 | 0.0346 | 0.0282 |
| BIF | 1 | 1.61 | 2.30 |

What is claimed:

1. A vessel having a lumen defined at least in part by a wall, the wall having an interior surface facing the lumen, an outer surface, and a plasma-enhanced chemical vapor deposition (PECVD) coating set supported by the wall, the PECVD coating set comprising:
   a water barrier coating or layer having a water contact angle from 80 to 180 degrees, optionally from larger than 80 degrees to less than 180 degrees, optionally from 90 degrees to 160 degrees, optionally from 100 degrees to 150 degrees, optionally from 110 degrees to 150 degrees, applied using a water barrier coating or layer precursor comprising at least one of a saturated or unsaturated, linear or cyclic aliphatic fluorocarbon precursor having from 1 to 10, optionally 1 to 6, optionally 2 to 6 carbon atoms and from 4 to 20 fluorine atoms per molecule, optionally hexafluoropropylene ($C_3F_6$), octafluorocyclobutane ($C_4F_8$), tetrafluoroethylene ($C_2F_4$), hexafluoroethane ($C_2F_6$), hexafluoropropylene ($C_3F_6$), octafluorocyclobutane ($C_4F_8$), perfluorohexane ($C_6F_{14}$), perfluoro-2-methyl-2-pentene ($C_6F_{12}$); a saturated or unsaturated hydrocarbon having from 1 to 6 carbon atoms; a saturated or unsaturated hydrofluorocarbon having from 1 to 6 carbon atoms; or any combination thereof; and
   a gas barrier coating set including:
   an $SiO_x$ gas barrier coating or layer from 2 to 1000 nm thick, in which x is from 1.5 to 2.9 as measured by x-ray photoelectron spectroscopy (XPS), the gas barrier coating or layer having an interior surface facing the lumen and an outer surface facing the interior surface of the wall, the gas barrier coating or layer being effective to reduce the ingress of atmospheric gas into the lumen compared to a vessel without a gas barrier coating or layer, and a pH protective coating or layer comprising $SiO_xC_y$ or $SiN_xC_y$ in which x is from about 0.5 to about 2.4 and y is from about 0.6 to about 3 as measured by XPS, the pH protective coating or layer having an interior surface facing the lumen and an outer surface facing the interior surface of the gas barrier coating or layer;

in which the water barrier coating or layer is between the gas barrier coating set and the interior surface of the wall.

2. The vessel of claim 1, in which the gas barrier coating set further comprises a tie coating or layer comprising $SiO_xC_y$ or $SiN_xC_y$ in which x is from about 0.5 to about 2.4 and y is from about 0.6 to about 3 as measured by XPS, the tie coating or layer having an interior surface facing the gas barrier coating or layer and an outer surface facing the water barrier coating or layer.

3. The vessel of claim 1, in which the water contact angle is larger than that of the same vessel coated with a water barrier coating or layer only or a gas barrier coating set only.

4. The vessel of claim 1, in which the water barrier coating or layer is applied directly on the wall and the gas barrier coating set is applied on top of the water barrier coating or layer; the gas barrier coating set further comprises a tie coating or layer comprising $SiO_xC_y$ or $SiN_xC_y$ in which x is from about 0.5 to about 2.4 and y is from about 0.6 to about 3 as measured by XPS; the tie coating or layer is in direct contact with the water barrier coating or layer; and the $SiO_x$ gas barrier coating or layer is in between the tie coating or layer and the pH protective coating or layer.

5. A vessel having a lumen defined at least in part by a wall, the wall having an interior surface facing the lumen, an outer surface, and a plasma-enhanced chemical vapor deposition (PECVD) coating set supported by the wall, the PECVD coating set comprising a water barrier coating or layer having a water contact angle from 80 to 180 degrees, optionally from larger than 80 degrees to less than 180 degrees, optionally from 90 degrees to 160 degrees, optionally from 100 degrees to 150 degrees, optionally from 110 degrees to 150 degrees, applied using a precursor comprising a saturated or unsaturated fluorocarbon precursor having from 1 to 6 carbon atoms, a saturated or unsaturated hydrocarbon having from 1 to 6 carbon atoms, a saturated or unsaturated hydrofluorocarbon having from 1 to 6 carbon atoms, or a combination of two or more of these precursors;

in which the water barrier coating or layer is in direct contact with the interior surface of the wall or the outer surface of the wall.

6. The vessel of claim 5, in which the water barrier coating or layer precursor comprises an unsaturated fluorocarbon precursor having from 2 to 6 carbon atoms, optionally hexafluoropropylene ($C_3F_6$), octafluorocyclobutane ($C_4F_8$), or any combination, composite or blend of any two or more of the above materials.

7. The vessel of claim 5, in which the water barrier coating or layer is in direct contact with the interior surface of the wall.

8. The vessel of claim 5, in which the water barrier coating or layer is in direct contact with the outer surface of the wall.

9. The vessel of claim 5, in which the water vapor transmission barrier improvement factor (BIF) of the vessel comprising the water barrier coating or layer, compared to the corresponding vessel without the water barrier coating or layer, is larger than 1, optionally 2, optionally 4, optionally 6, optionally 8.

10. The vessel of claim 5, in which the water vapor transmission rate (WVTR) of the vessel is lower than that of a corresponding vessel without the water barrier coating or layer.

11. The vessel of claim 5, in which the vapor transmission barrier improvement Factor (BIF) for at least one of water, dimethyl sulfoxide (DMSO), ethanol, or any combination of two or all of these, compared to the corresponding vessel without the water barrier coating or layer, is larger than 1, optionally between 2 and 20, optionally between 4 and 20, optionally between 6 and 20, optionally between 8 and 20, optionally between 2 and 10, optionally between 4 and 10, optionally between 6 and 10, optionally between 8 and 10, optionally between 2 and 5, optionally between 4 and 5, optionally between 1.5 and 10, optionally between 1.5 and 8, optionally between 1.5 and 6, optionally between 1.5 and 4, optionally between 1.5 and 2.

12. The vessel of claim 5, in which at least a portion of the wall comprises olefin polymer, polypropylene (PP), polyethylene (PE), cyclic olefin copolymer (COC), cyclic olefin polymer (COP), polymethylpentene, polystyrene, hydrogenated polystyrene, polycyclohexylethylene (PCHE), heteroatom-substituted hydrocarbon polymer, polyester, polyethylene terephthalate (PET), polyethylene naphthalate (PEN), polybutylene terephthalate (PBT), polyvinylidene chloride (PVdC), polyvinyl chloride (PVC), polycarbonate, polylactic acid, epoxy resin, nylon, polyurethane polyacrylonitrile, polyacrylonitrile (PAN), ionomeric resin, or any combination, composite or blend of any two or more of the above materials; optionally PET, COP or PP; optionally COP.

13. The vessel of claim 5, which is a microplate, a centrifuge tube, a well plate, a microwell plate, a vial, a pipette, a bottle, a jar, a syringe, a cartridge, a flask, a cryovial, a blister package, an ampoule, an evacuated blood collection tube, a specimen tube, a chromatography vial, a cosmetic container, a medical diagnostic straw, a sample vial, an assay tube, a transfer pipette, a reagent container, rigid or flexible tubing, a polymerase chain reaction (PCR) test system vessel, a cuvette, a pouch, a pump, a sprayer, a stopper, a needle, a plunger, a cap, a stent, a catheter, a cell culture flask, an Erlenmeyer cell culture flask, a roller bottle, a syringe barrel, or an implant.

14. The vessel of claim 5, having a lumen which is generally cylindrical.

15. The vessel of claim 5, in which the lumen has an inner diameter, an inner axial length, and an aspect ratio of inner axial length to inner diameter from 1:1 to 20:1, optionally from 1:1 to 15:1, optionally from 1:1 to 10:1, optionally from 1:1 to 5:1, optionally from 1:1 to 3:1, optionally from 1:1 to 2:1, optionally from 2:1 to 20:1, optionally from 2:1 to 15:1, optionally from 2:1 to 10:1, optionally from 2:1 to 5:1, optionally from 2:1 to 3:1, optionally from 3:1 to 20:1, optionally from 3:1 to 15:1, optionally from 3:1 to 10:1, optionally from 3:1 to 5:1, optionally from 5:1 to 20:1, optionally from 5:1 to 15:1, optionally from 5:1 to 10:1, optionally from 10:1 to 20:1, optionally from 10:1 to 15:1, optionally from 15:1 to 20:1.

16. The vessel of claim 5, containing a moisture sensitive material, optionally a lyophilized drug, a diagnostic reagent, or a topical tissue adhesive.

17. A method of making the vessel of claim 1, comprising:
at least partially evacuating a region adjacent to the interior surface of the wall, forming a partially evacuated region;
feeding the water barrier coating or layer precursor to the partially evacuated region and generating plasma in the partially evacuated region, forming a water barrier coating or layer supported by the wall adjacent to the evacuated region;

after the step of feeding the water barrier coating or layer precursor, feeding a precursor gas for a first coating or layer of the gas barrier coating set to the partially evacuated region and generating plasma in the partially evacuated region, forming a coating or layer of the gas barrier coating set supported by the wall adjacent to the evacuated region; and after feeding a precursor gas for a first coating or layer of the gas barrier coating set, feeding a precursor gas for a second coating or layer of the gas barrier coating set to the partially evacuated region and generating plasma in the partially evacuated region, forming a second coating or layer of the gas barrier coating set supported by the wall adjacent to the evacuated region.

18. The method of claim 17, in which, between at least two said feeding steps, the vacuum in the evacuated region is not broken.

19. The method of claim 17, in which, between at least three said feeding steps, the vacuum in the evacuated region is not broken.

* * * * *